US012627284B2

(12) United States Patent
Speir et al.

(10) Patent No.: US 12,627,284 B2
(45) Date of Patent: May 12, 2026

(54) TECHNIQUES FOR RECEIVER NON-LINEARITY CALIBRATION

(71) Applicant: Analog Devices, Inc., Wilmington, MA (US)

(72) Inventors: Carroll C. Speir, Pleasant Garden, NC (US); Nevena Rakuljic, Del Mar, CA (US)

(73) Assignee: Analog Devices, Inc., Wilmington, MA (US)

( * ) Notice: Subject to any disclaimer, the term of this patent is extended or adjusted under 35 U.S.C. 154(b) by 60 days.

(21) Appl. No.: 18/736,381

(22) Filed: Jun. 6, 2024

(65) Prior Publication Data

US 2025/0379565 A1     Dec. 11, 2025

(51) Int. Cl.
*H03K 5/1252*     (2006.01)
*H03M 1/12*     (2006.01)
*H03M 1/10*     (2006.01)

(52) U.S. Cl.
CPC ............ *H03K 5/1252* (2013.01); *H03M 1/12* (2013.01); *H03M 1/1009* (2013.01); *H03M 1/1028* (2013.01); *H03M 1/1033* (2013.01)

(58) Field of Classification Search
CPC .... H03K 5/1252; H03M 1/12; H03M 1/1009; H03M 1/1033; H03M 1/1028
See application file for complete search history.

(56) References Cited

U.S. PATENT DOCUMENTS

| | | | |
|---|---|---|---|
| 2002/0041247 A1 | 4/2002 | Steensgaard-madsen | |
| 2011/0102217 A1 | 5/2011 | Hsu | |
| 2022/0038110 A1* | 2/2022 | Bales ................. | H03M 1/1042 |

(Continued)

FOREIGN PATENT DOCUMENTS

| | | | |
|---|---|---|---|
| EP | 0682265 A1 | 11/1995 | |
| EP | 1972054 B1 | 1/2015 | |

(Continued)

OTHER PUBLICATIONS

"European Application Serial No. 25174901.6, Extended European Search Report mailed Nov. 11, 2025", 10 pgs.

(Continued)

*Primary Examiner* — Joseph J Lauture
(74) *Attorney, Agent, or Firm* — Schwegman Lundberg & Woessner, P.A.

(57)     ABSTRACT

Various techniques are described for correcting distortion in an analog input signal after digitization in a receiver signal chain. The techniques include a system that stores concatenated distortion correction terms, allowing for efficient data handling and processing. The techniques further include a system that has a smaller number of replica memories compared to primary memories, which store operational data. The replica memories are updated with new data and may be swapped with primary memories to update them without interrupting system operations. The techniques further include a dither system that uses two memories to store and process the dithered signals, which are then combined to produce a noise-corrected digital output. The techniques further include a system to correct distortions in analog input signals processed through multiple parallel paths.

20 Claims, 9 Drawing Sheets

(56) References Cited

U.S. PATENT DOCUMENTS

2022/0385318 A1    12/2022   Wang et al.
2024/0013848 A1     1/2024   Abhishek et al.

FOREIGN PATENT DOCUMENTS

EP          3537609  A1    9/2019
WO     WO-2006075505  A1    7/2006

OTHER PUBLICATIONS

Kasher, Morriel, et al., "Memory-Efficient SFDR-Optimized Post-Correction of Analog-to-Digital Converters via Frequency-Selective Look-Up Tables", 55th Asilomar Conference On Signals, Systems, And Computers, IEEE, (Oct. 31, 2021), 7 pgs.

Lundin, Henrik, et al., "Optimal Index-Bit Allocation For Dynamic Post-Correction Of Analog-To-Digital Converters", IEEE Transactions On Signal Processing, IEEE, USA, vol. 53, No. 2, (Feb. 1, 2005), 12 pgs.

"Taiwanese Application Serial No. 114119589, Office Action mailed Jan. 26, 2026", W/o English Translation, 7 pgs.

* cited by examiner

300

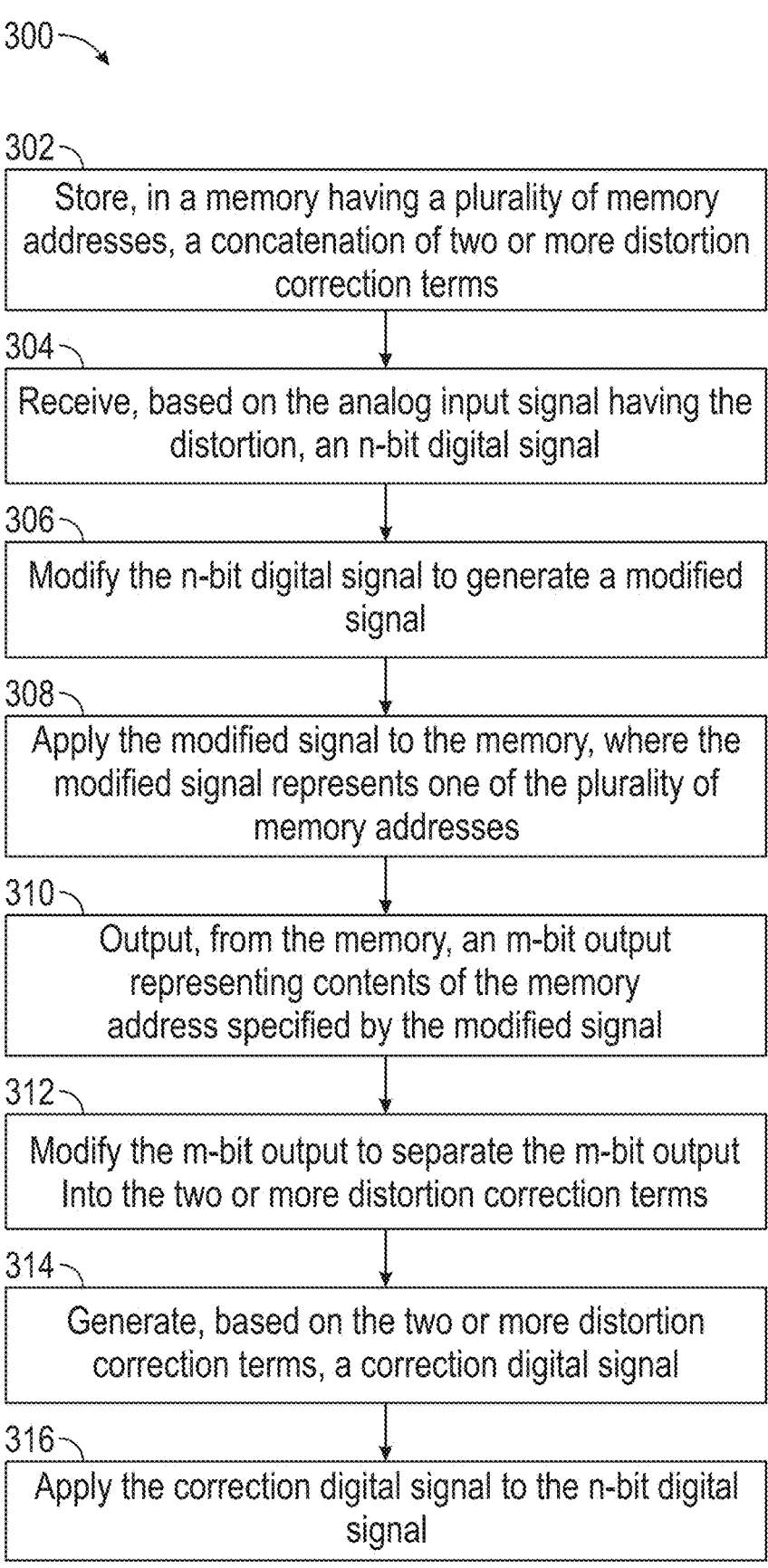

302

Store, in a memory having a plurality of memory addresses, a concatenation of two or more distortion correction terms

304

Receive, based on the analog input signal having the distortion, an n-bit digital signal

306

Modify the n-bit digital signal to generate a modified signal

308

Apply the modified signal to the memory, where the modified signal represents one of the plurality of memory addresses

310

Output, from the memory, an m-bit output representing contents of the memory address specified by the modified signal

312

Modify the m-bit output to separate the m-bit output Into the two or more distortion correction terms

314

Generate, based on the two or more distortion correction terms, a correction digital signal

316

Apply the correction digital signal to the n-bit digital signal

FIG. 3

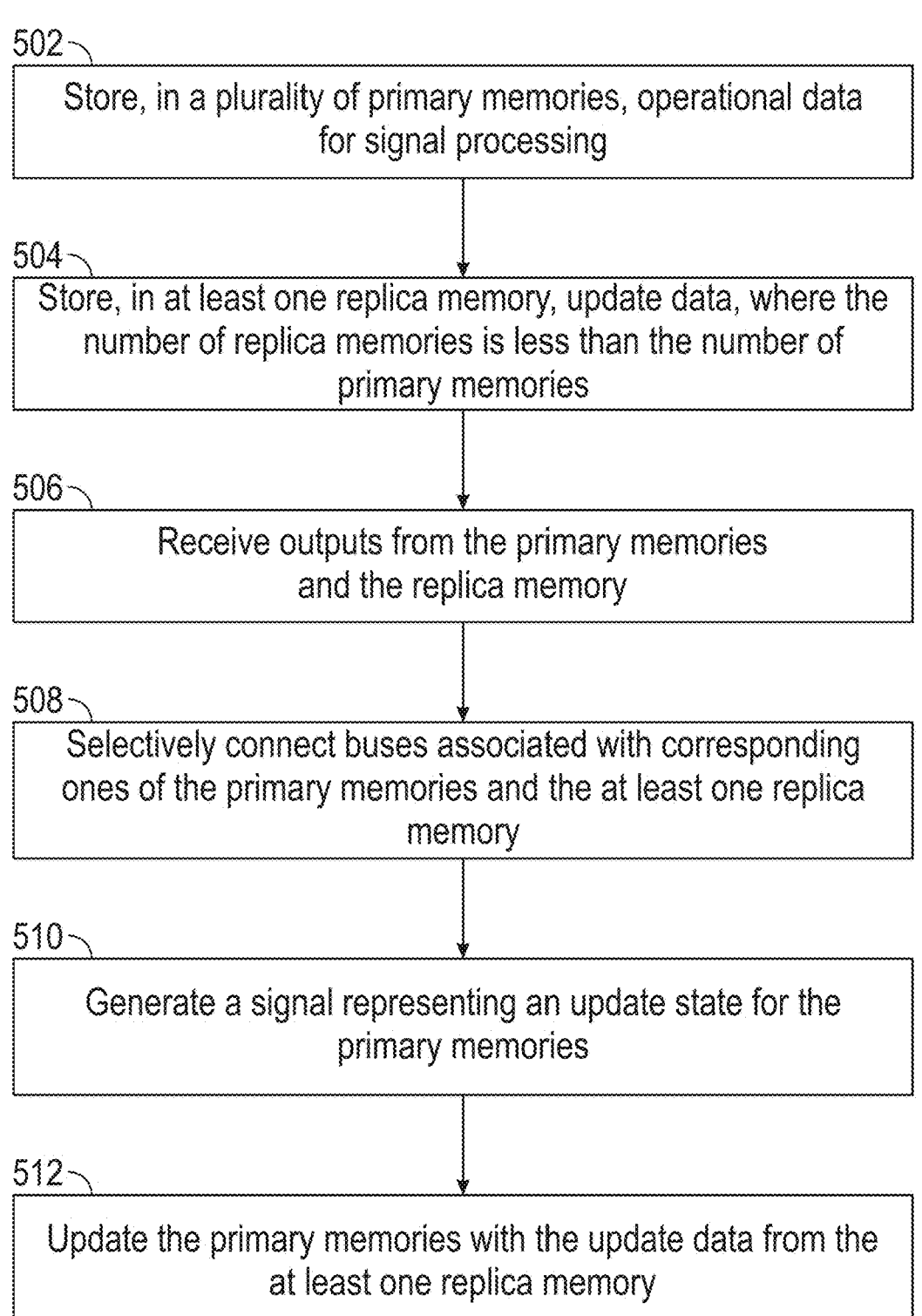

500

502
Store, in a plurality of primary memories, operational data for signal processing 504
Store, in at least one replica memory, update data, where the number of replica memories is less than the number of primary memories 506
Receive outputs from the primary memories and the replica memory 508
Selectively connect buses associated with corresponding ones of the primary memories and the at least one replica memory 510
Generate a signal representing an update state for the primary memories 512
Update the primary memories with the update data from the at least one replica memory

FIG. 5

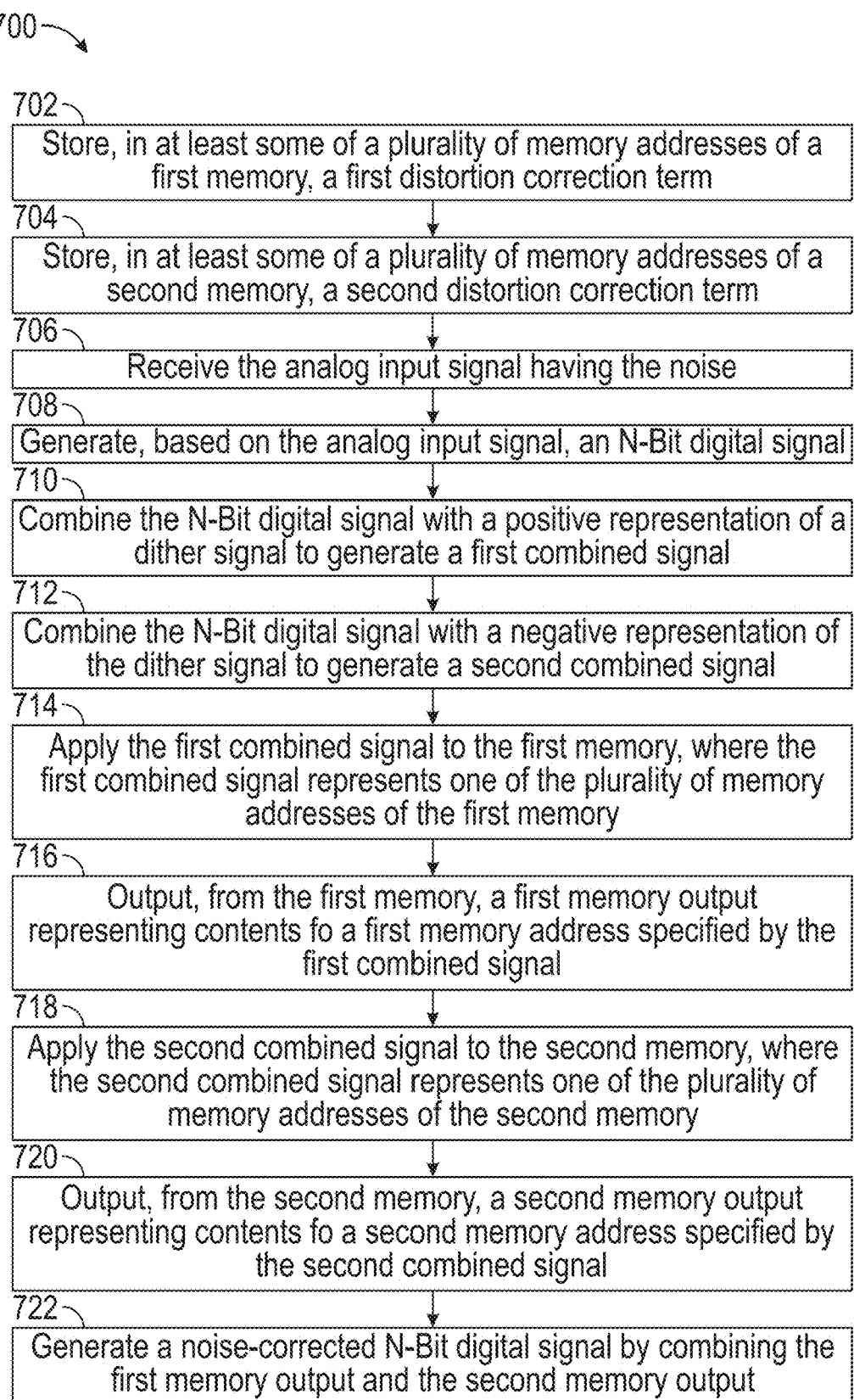

700

702 — Store, in at least some of a plurality of memory addresses of a first memory, a first distortion correction term 704 — Store, in at least some of a plurality of memory addresses of a second memory, a second distortion correction term 706 — Receive the analog input signal having the noise 708 — Generate, based on the analog input signal, an N-Bit digital signal 710 — Combine the N-Bit digital signal with a positive representation of a dither signal to generate a first combined signal 712 — Combine the N-Bit digital signal with a negative representation of the dither signal to generate a second combined signal 714 — Apply the first combined signal to the first memory, where the first combined signal represents one of the plurality of memory addresses of the first memory 716 — Output, from the first memory, a first memory output representing contents fo a first memory address specified by the first combined signal 718 — Apply the second combined signal to the second memory, where the second combined signal represents one of the plurality of memory addresses of the second memory 720 — Output, from the second memory, a second memory output representing contents fo a second memory address specified by the second combined signal 722 — Generate a noise-corrected N-Bit digital signal by combining the first memory output and the second memory output

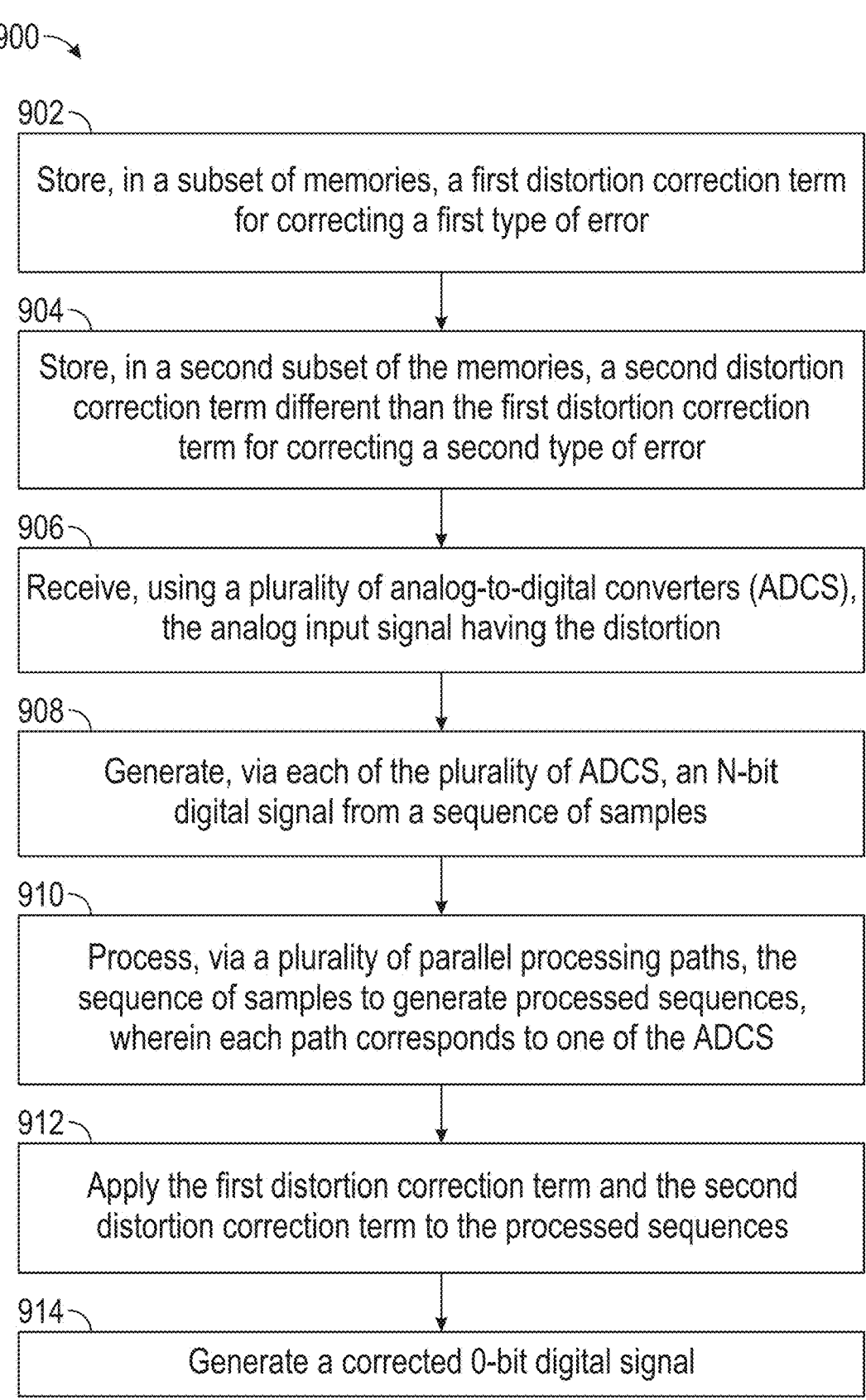

902

Store, in a subset of memories, a first distortion correction term for correcting a first type of error

904

Store, in a second subset of the memories, a second distortion correction term different than the first distortion correction term for correcting a second type of error

906

Receive, using a plurality of analog-to-digital converters (ADCS), the analog input signal having the distortion

908

Generate, via each of the plurality of ADCS, an N-bit digital signal from a sequence of samples

910

Process, via a plurality of parallel processing paths, the sequence of samples to generate processed sequences, wherein each path corresponds to one of the ADCS

912

Apply the first distortion correction term and the second distortion correction term to the processed sequences

914

Generate a corrected 0-bit digital signal

FIG. 9

TECHNIQUES FOR RECEIVER NON-LINEARITY CALIBRATION

FIELD OF THE DISCLOSURE

This document pertains generally, but not by way of limitation, to the field of integrated circuits, and in particular to receiver signal chains and digital correction techniques for the receiver signal chains.

BACKGROUND

Signal chains are fundamental components in a wide array of electronic systems, serving as the backbone for processing analog signals. These chains typically include a series of stages, each designed to perform specific functions such as amplification, filtering, and conversion. The signal chain may begin with an input transducer, like a microphone or sensor, which converts a physical phenomenon into an electrical signal. This signal is then conditioned through various stages to prepare it for analog-to-digital conversion, after which it may be processed by digital signal processing (DSP) hardware and/or software.

Nonlinearities in signal chains are deviations from the ideal linear response where the output is not directly proportional to the input. These nonlinearities may manifest in various forms, such as harmonic distortion, intermodulation distortion, and cross-talk, among others. The sources of nonlinearity in signal chains are diverse and may be attributed to the inherent characteristics of electronic components and the interactions between them.

The impact of nonlinearities on a signal chain's performance may be significant, particularly in high-precision applications such as instrumentation, communication systems, and audio processing. Nonlinearities may compromise the integrity of the signal, leading to errors in measurement, reduced dynamic range, and a lower signal-to-noise ratio (SNR). As such, understanding and managing these nonlinearities is important for maintaining the fidelity and accuracy of the signal as it passes through the chain.

In summary, signal chains including multiple functions are essential for the processing of analog signals in electronic systems, and nonlinearities within these chains pose challenges that may affect the overall systems performance. The ability to effectively manage and mitigate these nonlinearities is vital for ensuring the accurate and reliable operation of a wide range of electronic devices and systems.

SUMMARY OF THE DISCLOSURE

This disclosure describes various techniques for correcting distortion in an analog input signal after digitization in a receiver signal chain. The techniques include a system that stores concatenated distortion correction terms, allowing for efficient data handling and processing. The techniques further include a system that has a smaller number of replica memories compared to primary memories, which store operational data. The replica memories are updated with new data and may be swapped with primary memories to update them without interrupting system operations. The techniques further include a dither system that uses two memories to store and process the dithered signals, which are then combined to produce a noise-corrected digital output. The techniques further include a system to correct distortions in analog input signals processed through multiple parallel paths.

In some aspects, this disclosure is directed to a system for correcting distortion in an analog input signal, the system comprising: an analog-to-digital converter configured for receiving the analog input signal having the distortion, the analog-to-digital converter configured for generating an N-bit digital signal; and a digital processing circuit configured for receiving the N-bit digital signal, the digital processing including: a memory having a plurality of memory addresses and configured for receiving the N-bit digital signal, wherein at least some of the plurality of memory addresses are configured to store a concatenation of two or more distortion correction terms; wherein the digital processing circuit is configured for: modifying the N-bit digital signal to generate a modified signal; applying the modified signal to the memory, wherein the modified signal represents one of the plurality of memory addresses; outputting, from the memory, an M-bit output representing contents of the memory address specified by the modified signal; modifying the M-bit output to separate the M-bit output into the two or more distortion correction terms; generating, based on the two or more distortion correction terms, a correction digital signal; and applying the correction digital signal to the N-bit digital signal.

In some aspects, this disclosure is directed to a method for correcting distortion in an analog input signal, the method comprising: storing, in a memory having a plurality of memory addresses, a concatenation of two or more distortion correction terms; receiving, based on the analog input signal having the distortion, an N-bit digital signal; modifying the N-bit digital signal to generate a modified signal; applying the modified signal to the memory, wherein the modified signal represents one of the plurality of memory addresses; outputting, from the memory, an M-bit output representing contents of the memory address specified by the modified signal; modifying the M-bit output to separate the M-bit output into the two or more distortion correction terms; generating, based on the two or more distortion correction terms, a correction digital signal; and applying the correction digital signal to the N-bit digital signal.

In some aspects, this disclosure is directed to a system for correcting distortion in an analog input signal, the system including an analog-to-digital converter configured for receiving the analog input signal having the distortion, the analog-to-digital converter configured for generating an N-bit digital signal, the system comprising: a digital processing circuit configured for receiving the N-bit digital signal, the digital processing including: a memory having a plurality of memory addresses and configured for receiving the N-bit digital signal; wherein the digital processing circuit is configured for: concatenating two or more distortion correction terms; storing the concatenation of the two or more distortion correction terms in a memory address; modifying the N-bit digital signal to generate a modified signal; applying the modified signal to the memory, wherein the modified signal represents one of the plurality of memory addresses; outputting, from the memory, an M-bit output representing contents of the memory address specified by the modified signal; modifying the M-bit output to separate the M-bit output into the two or more distortion correction terms; generating, based on the two or more distortion correction terms, a correction digital signal; and applying the correction digital signal to the N-bit digital signal.

In some aspects, this disclosure is directed to a system for correcting distortion in an analog input signal, the system comprising: a plurality of primary memories configured to store operational data for signal processing; at least one replica memory configured to store update data, wherein the number of replica memories is less than the number of primary memories; a digital data path configured to receive outputs from the primary memories and the replica memory; data selectors associated with corresponding ones of the primary memories and the replica memory, the data selectors configured to selectively connect buses associated with the respective memories, wherein the data selectors are configured to receive a signal representing an update state for the primary memories, and wherein the data selectors are configured to respond to the signal by enabling the update of the primary memories with the update data from the at least one replica memory.

In some aspects, this disclosure is directed to a method for correcting distortion in an analog input signal, the method comprising: storing, in a plurality of primary memories, operational data for signal processing; storing, at least one replica memory, update data, wherein the number of replica memories is less than the number of primary memories; receiving outputs from the primary memories and the replica memory; selectively connecting buses associated with corresponding ones of the primary memories and the at least one replica memory; generating a signal representing an update state for the primary memories; and updating the primary memories with the update data from the at least one replica memory.

In some aspects, this disclosure is directed to a system for correcting distortion in an analog input signal, the system comprising: a digital processing circuit including: a plurality of primary memories configured to store operational data for signal processing; at least one replica memory configured to store update data, wherein the number of replica memories is less than the number of primary memories; a digital data path configured to receive outputs from the primary memories and the replica memory; data selectors associated with corresponding ones of the primary memories and the replica memory, the data selectors configured to selectively connect buses associated with the respective memories, wherein the digital processing circuit is configured for receiving a signal representing an update state for the primary memories, wherein the data selectors respond to the signal by enabling the update of the primary memories with the update data from the at least one replica memory, and wherein the digital processing circuit is configured for operating in at least one of: an operational mode wherein the plurality of primary memories provide outputs based on current operational data during non-update periods, wherein the operational data is based on a representation of an input signal; an update mode wherein the at least one replica memory provides outputs based on the update data during update periods, wherein one or more of the plurality of primary memories are updated with the update data from the replica memory, and wherein the roles of the plurality of primary memories and the at least one replica memory are interchangeably switched such that a primary memory becomes a replica memory for receiving update data, and the replica memory becomes a primary memory for providing outputs to the digital data path.

In some aspects, this disclosure is directed to a system for correcting distortion in an analog input signal, the system comprising: a plurality of analog-to-digital converters (ADCs) configured for receiving the analog input signal having the distortion, each of the analog-to-digital converters configured for generating an N-bit digital signal, each of the plurality of ADCs configured for generating a sequence of samples; and a digital processing circuit configured for receiving each of the N-bit digital signals, the digital processing circuit including: a plurality of parallel processing paths, each path corresponding to one of the ADCs and configured to process the sequence of samples to generate processed sequences; and a plurality of memories, each memory associated with one of the parallel processing paths and configured for storing distortion correction terms, wherein the digital processing circuit is configured for: applying the distortion correction terms from the memories to the processed sequences; and generating a correction O-bit digital signal, wherein a first subset of the memories is configured for storing a first distortion correction term for correcting a first type of error, and wherein a second subset of the memories is configured for storing a second distortion correction term different than the first distortion correction term for correcting a second type of error.

In some aspects, this disclosure is directed to a method for correcting distortion in an analog input signal, the method comprising: storing, in a subset of memories, first distortion correction terms for correcting a first type of error; storing, in a second subset of the memories, a second distortion correction term different than the first distortion correction term for correcting a second type of error; receiving, using a plurality of analog-to-digital converters (ADCs), the analog input signal having the distortion; generating, via each of the plurality of ADCS, an N-bit digital signal from a sequence of samples; processing, via a plurality of parallel processing paths, the sequence of samples to generate processed sequences, wherein each path corresponds to one of the ADCs; applying the first correction distortion correction term and the second distortion correction term to the processed sequences; and generating a correction O-bit digital signal.

In some aspects, this disclosure is directed to a system for correcting distortion in an analog input signal, the system comprising: an interleaved ADC having a first sub-ADC and a second sub-ADC and configured for receiving the analog input signal having the distortion, each of the first sub-ADC and the second sub-ADC configured for generating an N-bit digital signal from a sequence of samples; and a digital processing circuit configured for receiving each of the N-bit digital signals, the digital processing circuit including: a plurality of parallel processing paths, each path corresponding to one of the ADCs and configured to process the sequence of samples to generate processed sequences; and a plurality of memories, each memory associated with one of the parallel processing paths and configured for storing distortion correction terms, wherein the digital processing circuit is configured for: applying the correction distortion correction terms from the memories to the processed sequences; and generating a correction O-bit digital signal, wherein a first subset of the memories is configured for storing a first distortion correction term for correcting a first type of error, and wherein a second subset of the memories is configured for storing a second distortion correction term different than the first distortion correction term for correcting a second type of error.

In some aspects, this disclosure is directed to a system for reducing noise in a digitized input signal, the system comprising: an analog-to-digital converter configured for receiving an analog input signal having the noise, the analog-to-digital converter configured for generating an N-bit digital signal; a digital processing circuit configured for receiving the N-bit digital signal, the digital processing circuit including: first and second memories, wherein each of the first and second memories includes a plurality of memory addresses, wherein the first memory is configured for storing a first distortion correction term in at least some of the plurality of memory addresses of the first memory, and wherein the second memory is configured for storing a second distortion correction term in at least some of the plurality of memory addresses of the second memory; and a dither generator configured for generating a dither signal, wherein the digital processing circuit is configured for: combining the N-bit digital signal with a positive representation of the dither signal to generate a first combined signal; combining the N-bit digital signal with a negative representation of the dither signal to generate a second combined signal; applying the first combined signal to the first memory, wherein the first combined signal represents one of the plurality of memory addresses of the first memory; outputting, from the first memory, a first memory output representing contents of a first memory address specified by the first combined signal; applying the second combined signal to the second memory, wherein the second combined signal represents one of the plurality of memory addresses of the second memory; outputting, from the second memory, a second memory output representing contents of a second memory address specified by the second combined signal; and generating a noise-corrected N-bit digital signal by combining the first memory output and the second memory output signal.

In some aspects, this disclosure is directed to a method for reducing noise in a digitized input signal, the method comprising: storing, in at least some of a plurality of memory addresses of a first memory, a first distortion correction term; storing, in at least some of a plurality of memory addresses of a second memory, a second distortion correction term; receiving an analog input signal having the noise; generating, based on the analog input signal, an N-bit digital signal; combining the N-bit digital signal with a positive representation of a dither signal to generate a first combined signal; combining the N-bit digital signal with a negative representation of the dither signal to generate a second combined signal; applying the first combined signal to the first memory, wherein the first combined signal represents one of the plurality of memory addresses of the first memory; outputting, from the first memory, a first memory output representing contents of a first memory address specified by the first combined signal; applying the second combined signal to the second memory, wherein the second combined signal represents one of the plurality of memory addresses of the second memory; outputting, from the second memory, a second memory output representing contents of a second memory address specified by the second combined signal; and generating a noise-corrected N-bit digital signal by combining the first memory output and the second memory output.

In some aspects, this disclosure is directed to a system for reducing noise in a digitized input signal, the system comprising: an analog-to-digital converter configured for receiving an analog input signal having the noise, the analog-to-digital converter configured for generating an N-bit digital signal; and a dither generator configured for generating a dither signal, wherein the digital processing circuit is configured for: combining the N-bit digital signal with a positive representation of the dither signal to generate a first combined signal; combining the N-bit digital signal with a negative representation of the dither signal to generate a second combined signal; applying the first combined signal to a first memory, wherein the first combined signal represents one of the plurality of memory addresses of the first memory; outputting, from the first memory, a first memory output representing contents of a first memory address specified by the first combined signal; applying the second combined signal to a second memory, wherein the second combined signal represents one of the plurality of memory addresses of the second memory; outputting, from the second memory, a second memory output representing contents of a second memory address specified by the second combined signal; and generating a noise-corrected N-bit digital signal by combining the first memory output and the second memory output.

BRIEF DESCRIPTION OF THE DRAWINGS

In the drawings, which are not necessarily drawn to scale, like numerals may describe similar components in different views. Similar components in different views may be described by like numerals. The drawings illustrate generally, by way of example, but not by way of limitation, various embodiments discussed in the present document.

FIG. 3 is a flow diagram of an example of a method for correcting distortion in an analog input signal.

FIG. 5 is a flow diagram of an example of a method for correcting distortion in an analog input signal.

FIG. 7 illustrates a method for reducing noise in an analog input signal in accordance with one embodiment.

FIG. 9 is a flow diagram of an example of a method for correcting distortion in an analog input signal.

DETAILED DESCRIPTION

Distortion in a signal chain may degrade the quality of the processed signals. These distortions are particularly problematic in high-precision applications, such as in aerospace and defense industries, where signal integrity is important. The present inventors have recognized a need for improved techniques to correct errors associated with distortion in signal chains.

This disclosure describes various techniques for correcting distortion in an analog input signal after digitization in a receiver signal chain. The techniques include a system that stores concatenated distortion correction terms, allowing for efficient data handling and processing. The techniques further include a system that has a smaller number of replica memories compared to primary memories, which store operational data. The replica memories are updated with new data and may be swapped with primary memories to update them without interrupting system operations. This approach minimizes hardware resources and enhances system efficiency by using a rolling update process. The techniques further include a dither system that uses two memories to store and process the dithered signals, which are then combined to produce a noise-corrected digital output. This technique enhances the performance of the signal chains and ADCs, particularly in high performance applications. The techniques further include a system to correct distortions in analog input signals processed through multiple parallel paths. This system is particularly useful in configurations with interleaved ADCs, where different memories associated with each path store distinct distortion correction terms. By applying these terms to the processed sequences from each ADC, the system effectively corrects errors specific to each path, such as nonlinearity and interleaving errors. This tailored approach ensures high accuracy and integrity of the processed signals across different ADC configurations.

Figure 1:
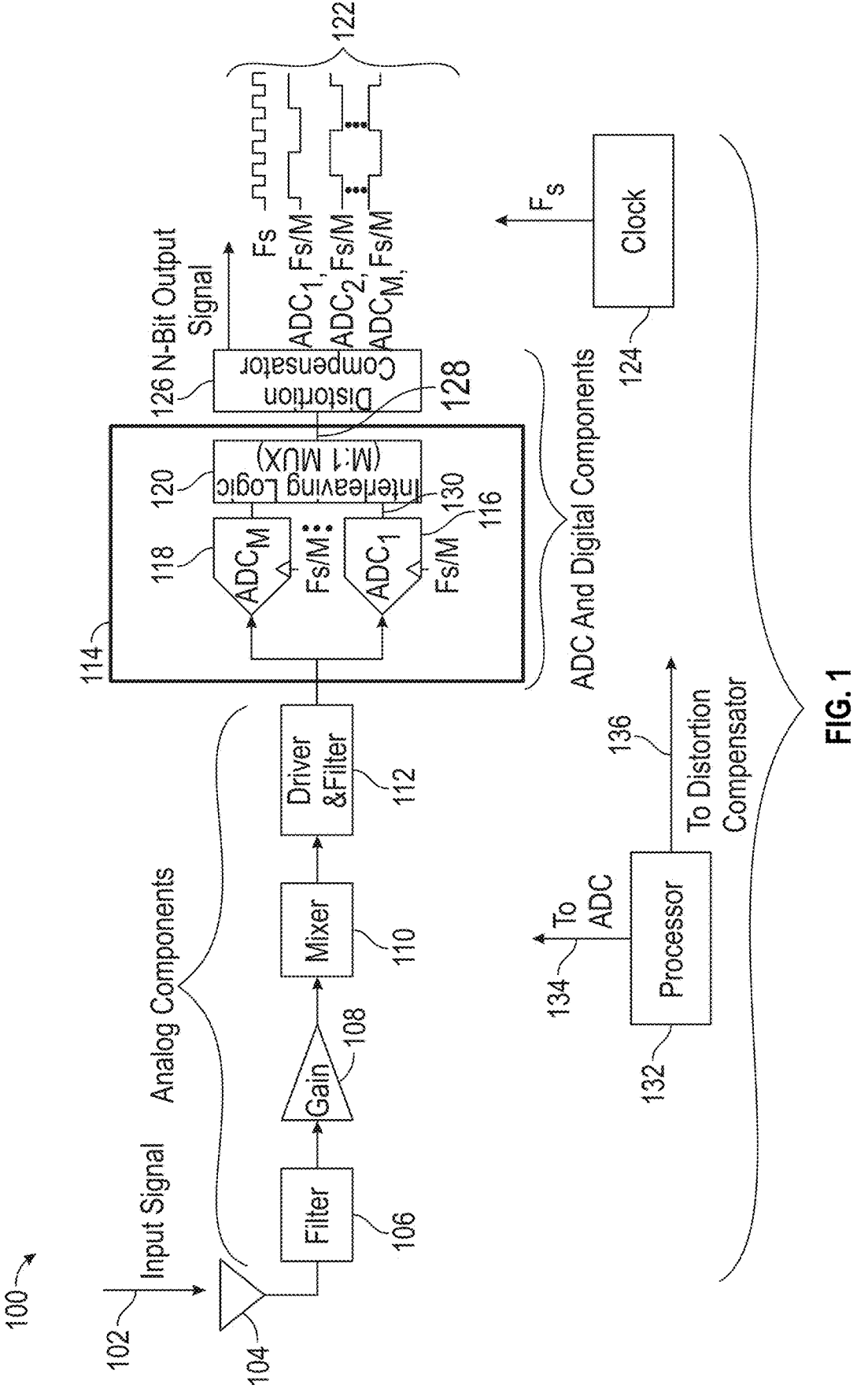
FIG. 1 is a simplified block diagram of an example of a signal chain that may implement various techniques of this disclosure.

FIG. 1 is a simplified block diagram of an example of a signal chain 100 that may implement various techniques of this disclosure. The signal chain 100 may be a Radio Frequency (RF) signal chain of a receiver configured to receive an analog input signal 102 via an antenna 104. The signal chain 100 includes various analog components. For example, a filter 106 may be coupled with the antenna 104 to filter the analog input signal 102. The output of the filter 106 may then be amplified by an amplifier 108. Optionally, such as in an intermediate frequency (IF) or zero IF architecture, the output of the amplifier 108 is coupled with a mixer 110, which may include additional filtering. In other examples, such as with direct RF sampling, the output of the amplifier 108 is applied directly to a driver and filter 112 without the use of the mixer 110.

The analog components are coupled with one or more analog-to-digital converters (ADCs) to convert the signal from the analog domain to the digital domain for further processing. In the example shown in FIG. 1, an ADC 114 is coupled with the output of the driver and filter 112 and configured to receive a representation of the analog input signal 102. A portion of the ADC 114 is considered an analog component and another portion is considered a digital component. The ADC 114 samples the analog input signal 102 and generates, based on those samples, an N-bit digital signal 128 that represents the analog input signal 102.

In some examples, the ADC 114 includes a plurality of ADCs. For example, the ADC 114 may include a plurality of sub-ADCs, such as two or more ADCs, shown as $ADC_1$ 116 through $ADC_M$ 118. In some examples, the plurality of ADCs, such as $ADC_1$ 116 through $ADC_M$ 118 are interleaved. That is, the plurality of ADCs are operated in an interleaved manner by interleaving logic 120. The interleaving logic 120 is a digital component in the signal chain 100.

Various clock signals 122 are shown to control the operation of the ADC 114. A clock 124 generates clock signals Fs to control the operation of the ADC 114. For multiple ADCs operating in an interleaved manner, the clock signal Fs may be used to generate M phase-shifted clock signals Fs/M, where M is the number of interleaved ADCs.

A processor 132 is in communication with the signal chain 100. The processor 132 is configured to generate signals 134 to control the operation of the ADC 114. The processor 132 is also configured to generate signals 136 to control the operation of the distortion compensator 126. The operation of the distortion compensator 126 is described below with respect to FIG. 2 through FIG. 9.

The analog input signal 102 may become distorted as it passes through the various analog components of the signal chain 100 up to and including sampling by the ADC 114. Errors, such as nonlinear distortion, of an analog input signal 102 in a signal chain 100 refers to any modification or alteration of the signal's waveform. Nonlinear distortion, such as harmonic distortion and intermodulation distortion, occurs when the output signal of a component is not a linear function of the input signal, which typically results from the nonlinear characteristics of components within the signal chain 100.

To correct distortion in an analog input signal 102, the signal chain 100 includes a digital processing circuit, namely the distortion compensator 126 to implement various techniques of this disclosure, as described in detail below.

Figure 2:
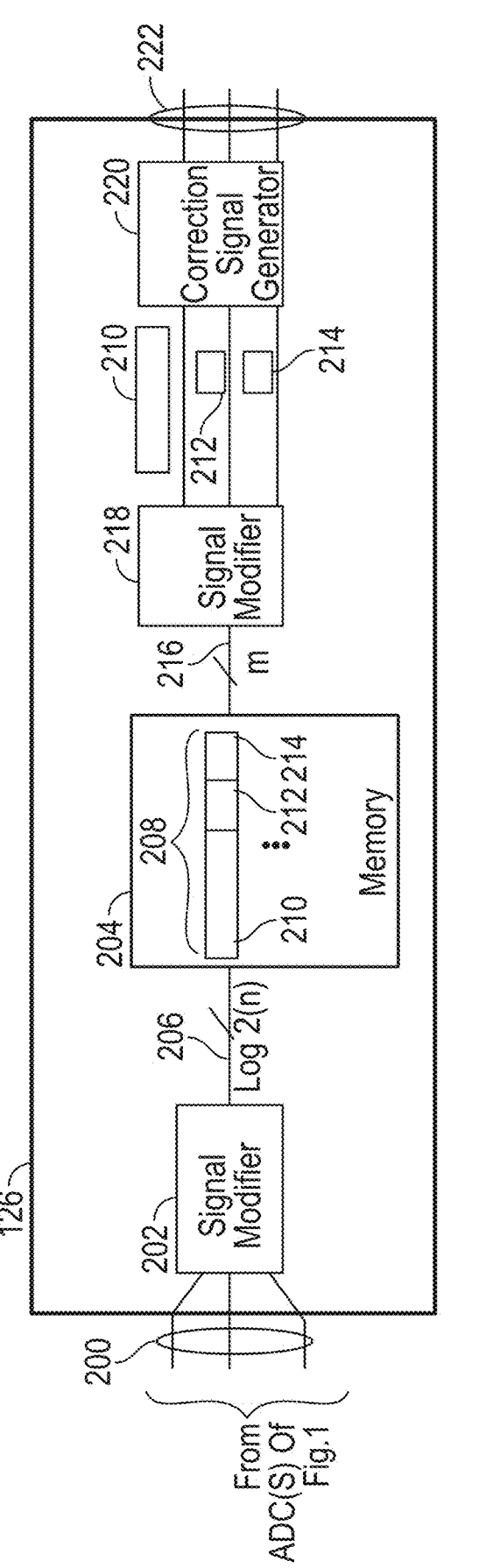
FIG. 2 is a block diagram of an example of a distortion compensator that may implement various techniques of this disclosure.

FIG. 2 is a block diagram of an example of a distortion compensator that may implement various techniques of this disclosure. The distortion compensator 126, implemented by a digital processing circuit, is configured to receive the N-bit digital signal 128 generated by the ADC 114 of FIG. 1. In the particular example shown in FIG. 2, the distortion compensator 126 receives M N-bit digital signals 200, which are the N-bit digital signals 130 outputted by corresponding ones of the $ADC_1$ 116 through $ADC_M$ 118 of FIG. 1. In some examples, there may be additional digital processing blocks between the N-bit digital signals and the distortion compensator 126. The distortion compensator 126 is in communication with the processor 132 (of FIG. 1).

The distortion compensator 126 may include a signal modifier 202, e.g., digital circuitry, to perform one or more signal modifications of the received N-bit digital signals 200 to generate a modified signal 206. As an example, modifying the N-bit digital signal includes reducing the number of bits of N-bit digital signals 200, such as reducing a 12-bit signal to a 6-bit modified signal 206. In other examples, modifying the N-bit digital signal includes applying dither to the N-bit digital signal, where dither is a signal for randomizing errors due to quantization or some other non-ideality and decorrelating the error from the desired signals. In other examples, modifying the N-bit digital signal includes applying gain to the N-bit digital signal.

The signal modifier 202 may also perform a mapping operation that maps signal inputs, namely the N-bit digital signals 200, to an address in a memory 204, where the memory location corresponds to a combination of signal input values. The memory 204 is included in or coupled with the digital processing circuit, such as the distortion compensator 126. The memory 204 may include one or more lookup tables.

The memory 204 has a size of Q×M and a plurality of memory addresses. Each memory address corresponds to an M-bit word, where at least some of the plurality of memory addresses are configured to store a concatenation of two or more distortion correction terms of a distortion equation, such as a Hammerstein filter model having the distortion correction terms $a_{0,k}x^k[n]+a_{1,k}x^k[n-1]+ \ldots +a_{31,k}x^k[n-31]$, k={2, 3}, where [n], [n–1], [n–2], etc. represent time delays of the distortion correction terms, and where k specifies the order, e.g., 2 equals second-order non-linearity and 3 equals third-order non-linearity. Other filter models may be used, such as a Volterra model with other distortion correction terms.

The distortion compensator 126 applies an input signal, e.g., x[n], to the memory 204. Time-delayed terms of the distortion equation are concatenated and stored as a single entry at a memory address 208 of the memory 204. For example, all of the [n] terms may be concatenated and stored together, as shown at first distortion correction term 210, then all of the [n–1] terms may be concatenated and stored together, as a first shown at second distortion correction term 212, then all of the [n–2] terms may be concatenated and stored together, as shown at third distortion correction term 214, and so forth. With the specific Hammerstein filter model, the distortion correction term $a_{0,k}x^k[n]$ may be stored as first distortion correction term 210, with k replaced by 2 and 3, the distortion correction term $a_{1,k}x^k[n-1]$ may be stored as second distortion correction term 212, with k replaced by 2 and 3, and so forth. All of these distortion correction terms are stored in the memory 204, e.g., in a lookup table, as a single entry.

Each M-bit word in the memory 204 may store one or more values of variable bitwidths for the first distortion correction term 210, second distortion correction term 212, third distortion correction term 214, where the sum of the bitwidths of all values contained in the word is less than or equal to size M. As non-limiting example, the M-bit word may be a 64-bit word.

The memory 204 is indexed such that an address of the memory 204 is x[n]. Then, the modified signal 206 is applied to the memory 204, where the modified signal 206 represents one of the plurality of memory addresses of the memory 204. For that modified signal x[n], all of the terms are retrieved from the memory address 208 to provide corresponding delays at the output of the memory 204. The distortion compensator 126 outputs, from the memory 204, an M-bit output 216 that represents contents of the memory address 208 specified by the modified signal 206.

In some examples, the distortion compensator 126, such as the signal modifier 202, applies a scaling factor B to the N-bit digital signals 200, where the two or more distortion correction terms are scaled by 1/B. That is, the memory address 208 may include a number P scaled outputs from the signal modifier 202 where one or more its outputs are multiplied by a scaling factor B and where each output value in memory 204 is scaled by another function whose argument is an inverse of the scaling factor, or 1/B. By way of a non-limiting example, the memory address may be {x(k), 0.25*x(k−1), 0.1*y(k−3), 1.6*z(k−7)} and the output words may be x(k)$^2$+8x(k−1)$^3$, 64x(k−1)$^3$, 6.25y(k−3)z(k−7)).

In some examples, the distortion compensator 126 applies a corresponding scaling factor A to the M-bit output 216. By way of non-limiting example, assume output values 4x(k)$^2$+8x(k)$^3$, 64x(k−1)$^3$, 2y(k−3)z(k−7). 4x(k)$^2$+8x(k)$^3$ are too large to fit within the designated bits in memory. What may be stored in memory is 2x(k)$^2$+4x(k)$^3$, 64x(k−1)$^3$, 2$y$(k−3)z(k−7) and a signal modifier 218, e.g., digital logic, may multiply 2x(k)$^2$+4x(k)$^3$ by 2 (left shift by 1) to restore the desired 4x(k)$^2$+8x(k)$^3$). One benefit of scaling is that a wide range of output words may be handled with one memory size. [0047] In some examples, if all output words are scaled in the memory 204, scaling may be undone by operating on the output of a function, e.g., by undoing the scaling at the function output. By way of a non-limiting example, assume output values output values 4x(k)$^2$+8x(k)$^3$, 64x(k−1)$^3$ are too large to fit within the designated bits in memory. What may be stored in memory is 2x(k)$^2$+4x(k)$^3$, 32x(k−1)$^3$, that is used to generate combined output 2x(k)$^2$+4x(k)$^3$+32x(k−1)$^3$. In this case to restore desired output signal, combined output 2x(k)$^2$+4x(k)$^3$+32x(k−1)$^3$ may be multiplied by 2 (left shift by 1).

Using a signal modifier 218, e.g., such as configured to form linear or nonlinear functions, the distortion compensator 126 modifies the M-bit output 216 to separate the M-bit output into the distortion correction terms that were originally concatenated and stored in the memory address 208. As seen in FIG. 2, the signal modifier 218 separates the M-bit word stored at memory address 208 and outputs the first distortion correction term 210, e.g., a 32-bit word, the second distortion correction term 212, e.g., a 16-bit word, the third distortion correction term 214, e.g., a 16-bit word, and so forth. Again, the first distortion correction term 210, the second distortion correction term 212, and the third distortion correction term 214 may correspond to different time delays.

The distortion compensator 126 includes a correction signal generator 220 to generate, based on the two or more distortion correction terms, a correction digital signal 222. In the example shown, there are multiple correction digital signals 222, which correspond to the multiple N-bit digital signals 200 received by the distortion compensator 126. Finally, the distortion compensator 126 then applies the correction digital signal(s) to the N-bit digital signal 128 of the ADC 114 of FIG. 1, or to the N-bit digital signals 130 of the ADC$_1$ 116 through ADC$_M$ 118 of FIG. 1, to correct for the distortion caused by the analog components up to and including the ADC 114.

These techniques may reduce the number of memories, e.g., lookup tables, needed by the system. For example, one larger memory may be included rather than several or many smaller memories. Fewer memories mean that the resulting area is smaller, resulting in less routing congestion and easier floorplanning due to fewer macros. In addition, using more memories has power implications because as the number of variables in a multivariable function increases, so does power consumption.

Periodically, the distortion compensator 126 updates the memory 204, e.g., the lookup tables in the memory 204. To effectively manage the system, it is important to compute the values stored in the memory 204, which are typically calculated from measurements. For example, it may be desirable to recalculate the distortion parameters stored in memory 204, e.g., from a Hammerstein filter model, due to changes in temperature that affect the nonlinearity of one or more analog components.

A significant challenge arises when memory 204 is actively engaged in a high-speed data path for correction purposes yet simultaneously requires updates from external sources. The conventional approach to address this involves maintaining completely separate copies of each memory 204. For example, for eight data paths, there may be 16 memories, with 8 memories in use and another 8 memories available for updating. The present inventors have recognized that this approach is highly inefficient. The present inventors have recognized a need for an approach, described below with respect to FIG. 4, that reduces the number of memories needed, thereby reducing the area and power consumption.

FIG. 3 is a flow diagram of an example of a method 300 for correcting distortion in an analog input signal. The processor 132 of FIG. 1 may generate signals to control one or more actions described with respect to the method 300. The method 300 corresponds to the techniques described with respect to FIG. 2. At block 302, the method 300 includes storing, in a memory having a plurality of memory addresses, a concatenation of two or more distortion correction terms of a distortion equation. In some examples, the two or more distortion correction terms have variable bitwidth. In some examples, the two or more distortion correction terms are time delayed.

At block 304, the method 300 includes receiving, based on the analog input signal having the distortion, an N-bit digital signal. At block 306, the method 300 includes modifying the N-bit digital signal to generate a modified signal. In some examples, modifying the N-bit digital signal includes reducing the number of bits of the N-bit digital signal. In some examples, modifying the N-bit digital signal includes applying dither to the N-bit digital signal. In some examples, modifying the N-bit digital signal includes applying gain to the N-bit digital signal. In some examples modifying the N-bit digital signal to generate the modified signal includes applying a scaling factor B to the N-bit digital signal, where the two or more distortion correction terms are scaled by 1/B. One or more of these different examples of modifying the N-bit digital signal may be combined.

At block 308, the method 300 includes applying the modified signal to the memory, wherein the modified signal represents one of the plurality of memory addresses. At block 310, the method 300 includes outputting, from the memory, an M-bit output representing contents of the memory address specified by the modified signal. In some examples, the method 300 includews applying a scaling factor to the M-bit output.

At block 312, the method 300 includes modifying the M-bit output to separate the M-bit output into the two or more distortion correction terms. At block 314, the method 300 includes generating, based on the two or more distortion correction terms, a correction digital signal. At block 316, the method 300 includes applying the correction digital signal to the N-bit digital signal.

Figure 4:
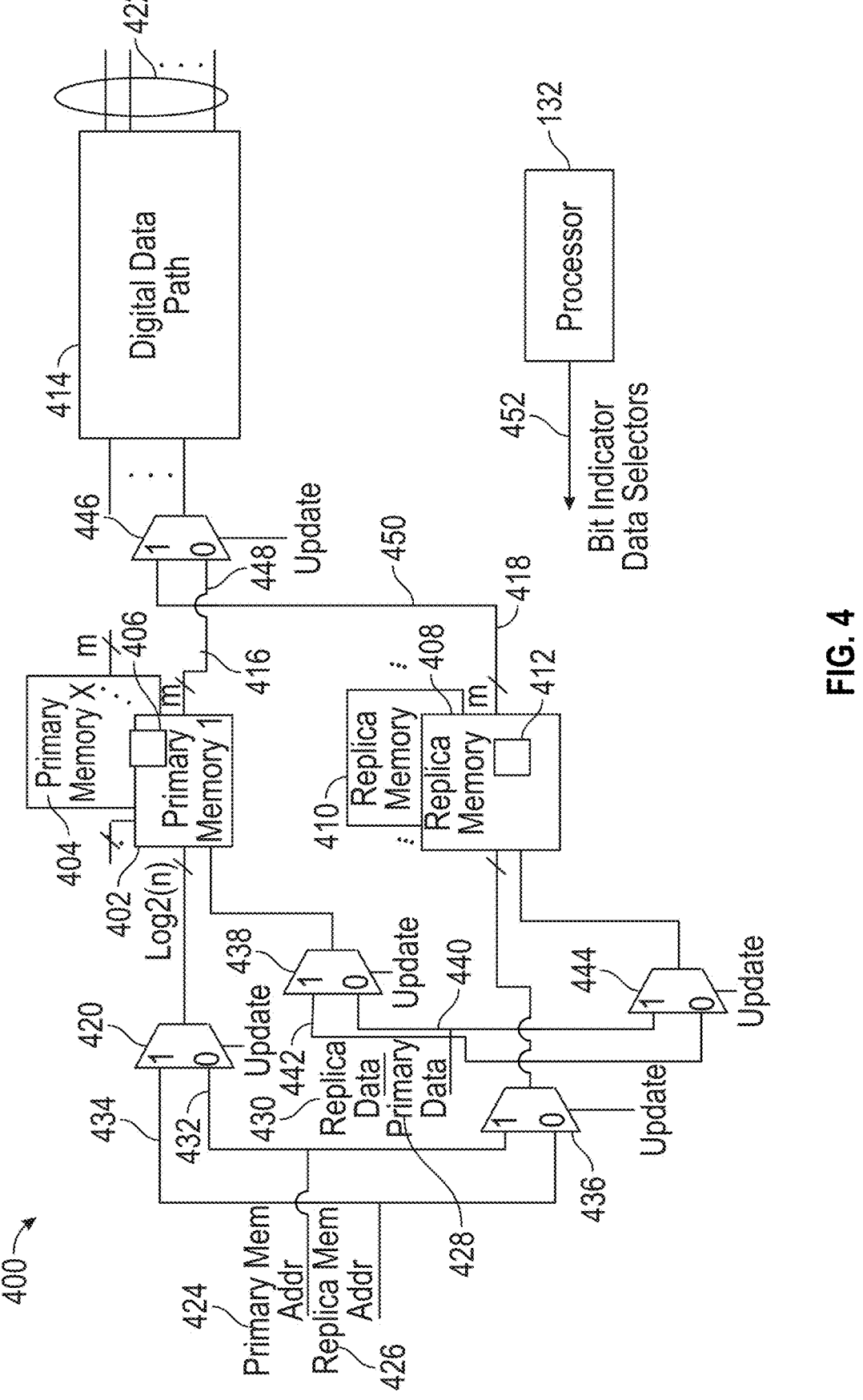
FIG. 4 is a block diagram of a replica memory system in the distortion compensator of FIG. 2.

FIG. 4 is a block diagram of a replica memory system 400 in the distortion compensator 126 of FIG. 2. Instead of doubling the number of memories needed so that the memories may be updated, as in conventional approaches, the techniques of FIG. 4 use as few as one additional memory (a "replica" memory") that may be programmed offline and then swapped, e.g., synchronously swapped, with the memory currently in use (a "primary" memory) by the distortion compensator 126 of FIG. 2.

The replica memory system 400 of FIG. 4 includes a plurality of primary memories configured to store correction coefficients 406 for signal processing, shown as first primary memory 402 through Xth primary memory 404. The primary memory 402 through the primary memory 404 are examples of the memory 204 of FIG. 2 and may store information similar to the memory 204, such as including distortion correction terms of a distortion equation.

The replica memory system 400 further includes one or more replica memories configured to store new correction coefficients to be used by the hardware at a future time, update data 412. The number of replica memories is less than the number of primary memories. For example, the replica memory system 400 shown includes a first replica memory 408 through a Yth replica memory 410 with replica memory 408 storing update data 412. The primary memories and the one or more replica memories are used for correcting distortions in a signal processing path, and the update data includes distortion correction terms for compensating for variations in a signal processing environment. The number of Y replica memories is less than the number X primary memories. Stated differently, the number of replica memories ranges from one to PM−1, where PM is the total number of primary memories.

In some examples, the number of replica memories is one, thereby providing a single replica memory for updating all primary memories, e.g., replica memory 408 to update the first primary memory 402 through the Xth primary memory 404. In some examples, the number of replica memories is half the number of primary memories. In some examples, the primary memories may be updated sequentially by the replica memory.

The replica memory system 400 includes a digital data path 414 configured to receive outputs from the primary memories and the replica memory, namely a primary memory output 416 and a replica memory output 418. The digital data path 414 includes an M-bit output 422, which corresponds to the M-bit output 216 of FIG. 2.

The replica memory system 400 receives one or more primary memory addresses 424, one or more replica memory addresses 426, primary data 428, and replica data 430. The primary memory address 424 corresponds with the modified signal 206 of FIG. 2. The replica memory system

400 includes data selectors, e.g., multiplexors, associated with the primary memories and the replica memory and configured to selectively connect buses associated with the respective memories, such as to select between the primary memory address 424, the replica memory address 426, the primary data 428, and the replica data 430. The data selectors are operatively connected to address, data, and output buses of the respective memories. For example, the data selector 420 is coupled with an address input of a primary memory and configured to select between a primary memory address bus 432 and a replica memory address bus 434. Similarly, the data selector 436 is coupled with an address input of a replica memory and configured to select between the primary memory address bus 432 and the replica memory address bus 434.

The data selector 438 is coupled with a data input of a primary memory and configured to select between a primary data bus 440 and a replica data bus 442. Similarly, the data selector 444 is coupled with a data input of a replica memory and configured to select between the primary data bus 440 and the replica data bus 442.

The replica memory address 426 is coupled with an output bus 448 of a primary memory and an output bus 450 of a replica memory and configured to receive either the primary memory output 416 or the replica memory output 418. The data selector 446 is configured to select between the output bus 448 of the primary memory and the output bus 450 of the replica memory and provide the corresponding primary memory output 416 or replica memory output 418 to the digital data path 414.

The replica memory system 400 is in communication with the processor 132 (of FIG. 1). The processor 132 is coupled with, e.g., in electrical communication with, the data selectors. The data selectors, e.g., multiplexors, include a selector input, e.g., an update input, that selects between the inputs of the data selector. The processor 132 is configured for generating one or more signals 452, such as representing an update state for the memories. In some examples, the signals 452 include a bit indicator for each memory that signals whether the memory is in an update mode or an operational mode. The data selectors are configured to switch between the update mode and the operational mode based on the bit indicator. The data selectors respond to the signal 452 by enabling an update of the primary memories with update data from the replica memory.

The replica memory system 400 may include an operational mode and an update mode, which may be controlled via signals from the processor 132 of FIG. 1. In the operational mode, the primary memories provide outputs, e.g., primary memory outputs 416, based on current operational data during non-update periods, where the operational data is based on a representation of an input signal, such as the analog input signal 102 of FIG. 1.

In the update mode, the replica memory provides outputs, e.g., replica memory outputs 418, based on the update data during update periods, where one or more primary memories are updated with the update data from the replica memory. In some examples, the update mode is performed without requiring a one-to-one correspondence between the primary memories and the replica memories, thereby reducing the hardware resources required for the system.

In some examples, the update mode includes a rolling update process that updates each primary memory using the replica memory or replica memories, thereby minimizing the impact on the signal processing and reducing the number of replica memories needed. In this process, while the primary memories are actively used in the system's operations, the replica memory is updated with new data. Once the update is complete, the roles of the primary and replica memories are switched. This means the updated replica memory becomes the primary memory, and one of the primary memories then takes the role of the replica to be updated next. This cycle continues, ensuring each memory is updated, e.g., sequentially, without interrupting the system's functionality. This rolling technique enhances efficiency by reducing the need for multiple copies of each memory, thereby saving on resources and simplifying the system architecture.

In the update mode, in some examples, the roles of the primary memory and the replica memory are interchangeably switched. Thus, a primary memory becomes a replica memory for receiving update data, and the replica memory becomes a primary memory for providing outputs to the digital data path 414.

In summary, the replica memory system 400 includes multiple primary memories that get updated one memory at a time, and one or more replica memories. Prior to updating the primary memories, the replica memory is updated with new information. During the update time, a primary memory is selected to be updated and, while it is being updated, its function is replaced by a replica memory. At this point, the primary memory is regarded as a new replica memory, and the process repeats until all primary memories are updated. One benefit of this technique is that instead of doubling the number of memories to allow simultaneous updates, only one extra memory is needed, which significantly reduces an area overhead. In some examples, more than one extra memory may be used, but still less than a doubling of the memories is needed.

Figure 6:
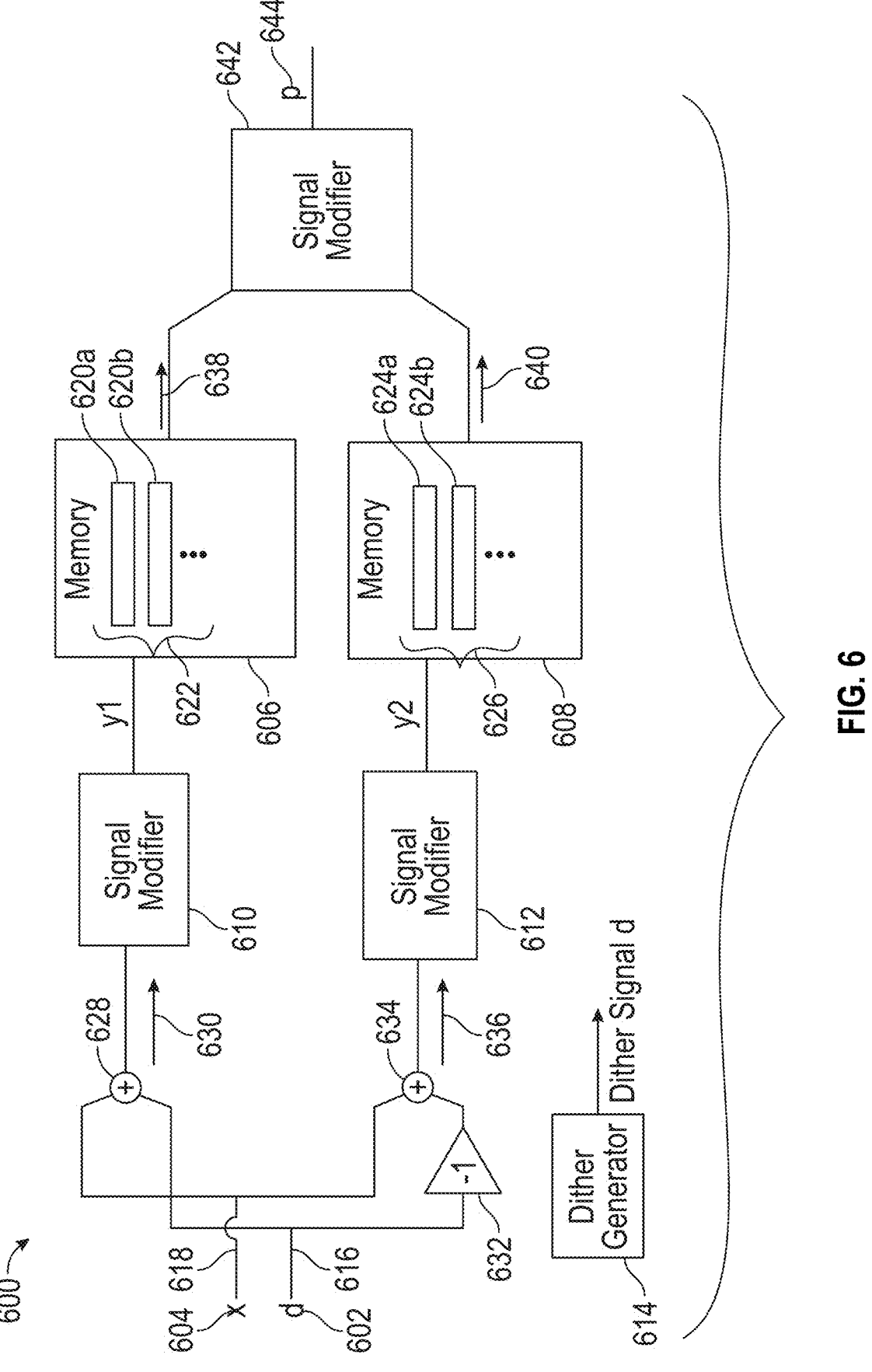
FIG. 6 is a block diagram of a dither system in the distortion compensator of FIG. 2.

Dithering may be desirable to introduce into converter systems, such as ADCs, to enhance performance by reducing quantization error and improving linearity. By adding a small amount of noise to the input signal, dither randomizes quantization errors, making them less correlated with the signal and reducing systematic distortion. This technique not only increases the perceived resolution of the system but also may reduce or prevent the formation of idle tones and pattern noise, particularly beneficial in high-fidelity audio and precision measurement applications. FIG. 6 describes techniques by which the distortion compensator 126 of FIG. 1 may introduce dithering.

FIG. 5 is a flow diagram of an example of a method 500 for correcting distortion in an analog input signal. The method 500 corresponds to the techniques described with respect to FIG. 4. The processor 132 of FIG. 1 may generate signals to control one or more actions described with respect to the method 500.

At block 502, the method 500 stores, in a plurality of primary memories, operational data for signal processing. At block 504, the method 500 stores, in at least one replica memory, update data, where the number of replica memories is less than the number of primary memories. At block 506, the method 500 receives outputs from the primary memories and the replica memory. At block 508, the method 500 selectively connects buses associated with corresponding ones of the primary memories and the at least one replica memory.

At block 510, the method 500 generates a signal representing an update state for the primary memories. At block 512, the method 500 updates the primary memories with the update data from the at least one replica memory.

In some examples, the method 500 includes operating in at least one of an operational mode wherein the plurality of primary memories provide outputs based on current operational data during non-update periods, where the operational data is based on a representation of an input signal; an update mode wherein the at least one replica memory provides outputs based on the update data during update periods, and wherein one or more of the plurality of primary memories are updated with the update data from the replica memory; and an update mode where the roles of the plurality of primary memory and the at least one replica memory are interchangeably switched such that a primary memory becomes a replica memory for receiving update data, and the replica memory becomes a primary memory for providing outputs to the digital data path.

In some examples, the method 500 includes performing the update mode without requiring a one-to-one correspondence between the plurality of primary memories and the at least one replica memory.

In some examples, the method 500 includes performing the update mode using a rolling update process that updates each of the plurality of primary memories using the at least one replica memory.

FIG. 6 is a block diagram of a dither system 600 in the distortion compensator 126 of FIG. 2. The dither system 600 of FIG. 6 is configured for reducing noise in a digitized input signal and makes use of the multiple memories shown in FIG. 4. The dither system 600 applies a dither signal 602 (signal "d") to an N-bit digital signal 604 (signal "x"), where the N-bit digital signal 604 is a representation of the analog input signal 102 of FIG. 1 that includes noise, and more particularly to the N-bit digital signals 200 of FIG. 2 from the ADC(s) of FIG. 1. The dither system 600 is in communication with the processor 132 (of FIG. 1).

In the example shown, the dither system 600 includes a first memory 606 and a second memory 608. In some examples, the first memory 606 and the second memory 608 correspond to first and second primary memories of FIG. 4. In other examples, the first memory 606 and second memory 608 correspond to first and second replica memories in FIG. 4. In yet other examples, the first memory 606 may be a primary memory (or replica memory) in FIG. 4 and the second memory 608 may be a replica memory (or a primary memory) in FIG. 4. The memory 606 and the memory 608 may be lookup tables.

The memory 606 includes a plurality of memory addresses 622, such as at least memory address 620a and memory address 620b. The memory addresses 622 may be similar to the memory address 206 of FIG. 2. The memory 606 is configured to store multiple concatenated distortion correction terms in the memory addresses 622.

Similarly, the memory 608 includes a plurality of memory addresses 626, such as at least memory address 624a and memory address 624b. The memory addresses 626 may be similar to the memory address 208 of FIG. 2. The memory 608 is configured to store a second distortion correction term of the distortion equation in the memory addresses 626.

In some examples, the first distortion correction term and the second distortion correction term are the same distortion correction term. In some examples, the first distortion correction term and the second distortion correction term are configured for correcting a first type of error. For example, the first type of error includes a nonlinearity error. In some examples, the nonlinearity error is a first-order linearity error. In other examples, the nonlinearity error includes nonlinearity errors higher than a first-order error, e.g., second-order, third-order, and higher.

A dither generator 614 is configured to generate the dither signal 602 (signal "d") that is applied at a dither input 616. The N-bit digital signal 604 (signal "x") is applied at the signal input 618. The distortion compensator 126 of FIG. 1 and in particular the dither system 600 of FIG. 6 includes a summing circuit 628 to combine the N-bit digital signal 604 with a positive representation of the dither signal 602 to generate a first combined signal 630. Similarly, the dither system 600 includes an inverter 632 and a summing circuit 634 to combine the N-bit digital signal 604 with a negative representation of the dither signal 602 to generate a second combined signal 636.

In some examples, a signal modifier 610, e.g., digital logic, performs one or more signal modifications of the first combined signal 630. In some examples, the signal modifier 610 is similar to the signal modifier 202 of FIG. 2. Similarly, in some examples, a signal modifier 612, e.g., digital logic, performs one or more signal modifications of the second combined signal 636. In some examples, the signal modifier 612 is similar to the signal modifier 202 of FIG. 2.

The dither system 600 applies the first combined signal 630, such as via the signal modifier 610, to the memory 606, where the first combined signal 630 represents one of the plurality of memory addresses 622 of the memory 606. In response, the memory 606 outputs a first memory output 638 that represents contents of a first memory address, e.g., memory address 620a, specified by the first combined signal 630.

The dither system 600 applies the second combined signal 636, such as via the signal modifier 612, to the memory 608, where the second combined signal 636 represents one of the plurality of memory addresses 626 of the memory 608. In response, the memory 608 outputs a second memory output 640 that represents contents of a second memory address, e.g., memory address 624a, specified by the second combined signal 636.

The first memory output 638 still includes the positive representation of the dither signal 602 and the second memory output 640 still includes the negative representation of the dither signal 602. The signal modifier 642, e.g., digital logic, is configured to combine the first memory output 638 and the second memory output 640 and generate a noise-corrected digital signal 644 (signal "p"). The dither signal 602 is eliminated by combining the first memory output 638 and the second memory output 640.

In some examples, the signal modifier 642 modifies the combination of the first memory output 638 and the second memory output 640. This may include scaling or other linear or non-linear digital signal processing functions including FIR filters.

The dither signal d(n) is added digital noise used to requantize x(n) prior to using x(n) as an address to the memory. The memory is used to correct a distortion, e.g., nonlinearities, such as second or higher order nonlinearities, in the analog input signal 102. The techniques of FIG. 6 minimize the impact of added digital noise in the system, such as used in the process of requantization, by driving one memory, e.g., the memory 606, with 0.5*(desired_signal+digital_noise) and the other memory, e.g., the memory 608, with 0.5*(desired_signal-digital_noise). Summing the output of these two memories, e.g., lookup tables, cancels at least most of the added digital noise.

As mentioned above, in some examples, the ADC 114 of FIG. 1 may include more than one ADC and those ADCs may be configured to operate in parallel. Such a configuration may include multiple data paths running in parallel for speed reasons. For example, each data path may include a corresponding memory, e.g., lookup table, such as the memory 204 of FIG. 2. In some examples, the memories in those parallel paths contain the same information. In accordance with this disclosure, however, the memories in those parallel paths may contain different information, as described below with respect to FIG. 8.

FIG. 7 is a flow diagram of an example of a method 900 for correcting distortion of an analog input signal. The method 700 corresponds to the techniques described with respect to FIG. 6. The processor 132 of FIG. 1 may generate signals to control one or more actions described with respect to the method 700.

At block 702, the method 700 stores, in at least some of a plurality of memory addresses of a first memory, a first distortion correction term of a distortion equation. At block 704, the method 700 stores, in at least some of a plurality of memory addresses of a second memory, a second distortion correction term of the distortion equation.

In some examples, the first distortion correction term and the second distortion correction term are the same distortion correction term. In some examples, the first distortion correction term and the second distortion correction term are configured for correcting a first type of error. In some examples, the first type of error includes a nonlinearity error. In some examples, the nonlinearity error is higher than a first-order linearity error.

At block 706, the method 700 receives the analog input signal having the noise. At block 708, the method 700 generates, based on the analog input signal, an N-bit digital signal.

At block 710, the method 700 combines the N-bit digital signal with a positive representation of a dither signal to generate a first combined signal. At block 712, the method 700 combines the N-bit digital signal with a negative representation of the dither signal to generate a second combined signal.

At block 714, the method 700 applies the first combined signal to the first memory, wherein the first combined signal represents one of the plurality of memory addresses of the first memory. At block 716, the method 700 outputs, from the first memory, a first memory output representing contents of a first memory address specified by the first combined signal.

At block 718, the method 700 applies the second combined signal to the second memory, wherein the second combined signal represents one of the plurality of memory addresses of the second memory. At block 720, the method 700 outputs, from the second memory, a second memory output representing contents of a second memory address specified by the second combined signal. At block 722, the method 700 generates a noise-corrected digital signal by combining the first memory output and the second memory output.

In some examples, the method 700 includes modifying the first combined signal before applying the first combined signal to the first memory, and modifying the second combined signal before applying the second combined signal to the second memory. Modifying the first combined signal may include reducing the number of bits and/or modifying the signal in the other ways described above, such as applying gain.

In some examples, the method 700 includes modifying the combination of the first memory output and the second memory output.

Figure 8:
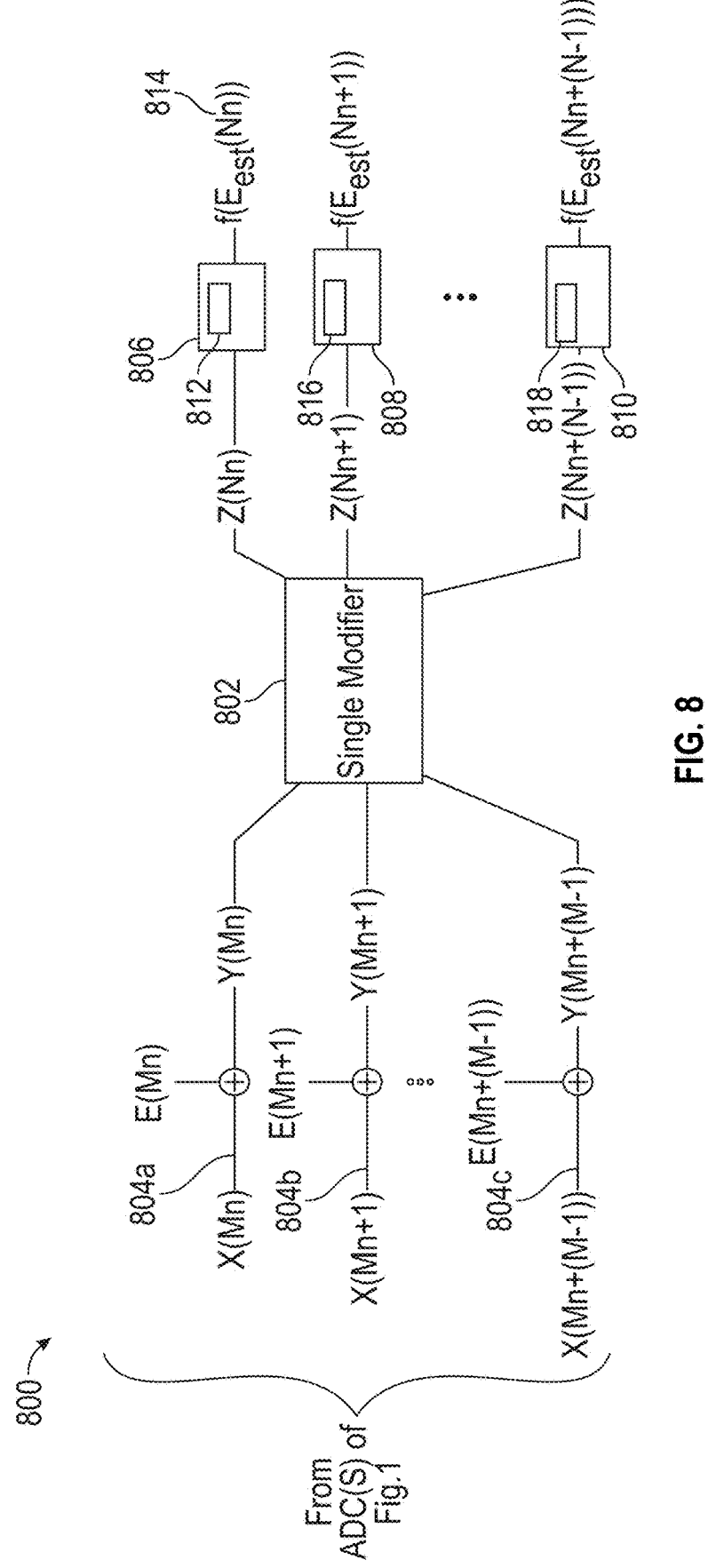
FIG. 8 depicts an example of a system for correcting distortion in an analog input signal.

FIG. 8 depicts an example of a system 800 for correcting distortion in an analog input signal. The system 800 is part of the distortion compensator 126 of FIG. 2, e.g., a digital processing circuit, and is in communication with the processor 132 (of FIG. 1).

As mentioned above, for configurations using multiple ADCs operated in parallel with corresponding data paths, memories in those parallel paths may contain different information. For example, assume that a two-way inter-leaved ADC includes a sub-ADC0 and a sub-ADC1, such as the ADC 114 of FIG. 1 including two sub-ADCs, namely ADC$_1$ 116 and ADC$_M$ 118, and four parallel processing paths. Further assume that there is a third-order receive (Rx) nonlinearity to be corrected, as well as interleaving gain mismatch between sub-ADC0 and sub-ADC1. The data may be digitally processed in four parallel paths and memories, e.g., lookup tables, are used to correct these errors, such as described above. In this example, memories 0 and 2 store the same distortion correction terms, and memories 1 and 3 store the same distortion correction terms, but memories 0 and 1 are different. That is, memories 0 and 2 store information that corrects third-order nonlinearity, while memories 1 and 3 store the same information that corrects third-order non-linearity plus interleaving gain error of sub-ADC1 relative to sub-ADC0. That is, by changing the entries of memories across the parallel paths, the system 800 corrects any errors specific to a particular path, such as interleaving errors.

FIG. 8 depicts a plurality of samples X(Mn), X(Mn+1) . . . X(Mn+(M−1)) generated by a corresponding ADC, such as sub-ADCs ADC$_1$ 116 through ADC$_M$ 118 of an inter-leaved ADC 114 of FIG. 1. Each ADC is configured for receiving an analog input signal having distortion, for gen-erating a sequence of samples, and for generating an N-bit digital signal. Each ADC may be operated in parallel and be part of a corresponding data path, such as parallel processing paths processing path 804a, processing path 804b, and processing path 804c. Each processing path, e.g., the pro-cessing path 804a, the processing path 804b, and the pro-cessing path 804c, correspond to an ADC.

In addition, each ADC may be associated with a corre-sponding error, shown in FIG. 8 as error signals E(Mn), E(Mn+1) . . . E(Mn+(M−1)). Each of processing path 804a, processing path 804b, and processing path 804c are config-ured to process the sequence of samples to generate pro-cessed sequences Y(Mn), Y(Mn+1) . . . Y(Mn+(M−1)), which are ADC samples plus the corresponding error asso-ciated with the ADC.

In some examples, the ADC output signals Y(Mn), Y(Mn+1) . . . Y(Mn+(M−1)) are applied to signal modifier 802, which may be similar to the signal modifier 202 of FIG. 2. The signal modifier 802 modifies the processed sequences Y(Mn), Y(Mn+1) . . . Y(Mn+(M−1)) and generates corre-sponding modified processed sequences Z(Nn), Z(Nn+1) . . . Z(Nn+(N−1)).

The system 800 includes a plurality of memories, where each memory is associated with one of the parallel process-ing paths and configured for storing distortion correction terms. For example, the system 800 includes a first memory 806, a second memory 808, and an Nth memory 810 that are associated with corresponding ones of the processing path 804a, the processing path 804b, and the processing path 804c. The first memory 806, the second memory 808, and the Nth memory 810 may each be similar to the memories of FIG. 2, FIG. 4, and/or FIG. 6.

Each of the memories in FIG. 8 may include one or more memory addresses configured to store distortion correction terms of a distortion equation, such as described above. For example, the memory 806 includes at least one memory address 812 configured to store distortion correction terms of a distortion equation, e.g., concatenated distortion cor-rection terms, such as described above, with respect to FIG. 2. The system 800 applies the distortion correction terms from the memories to the processed sequences to correct for errors. For example, the system 800 applies the distortion correction terms from memory address 812 of the memory 806 to the processed sequence Z(Nn) to generate a correc-tion O-bit digital signal 814 f$_{(Est}$(Nn)).

The memory 808 and the memory 810 are similarly configured. The memory 808 includes at least one memory address 816 and the memory 810 includes at least one memory address 818, where the memory address 816 and the memory address 818 are each configured to store dis-tortion correction terms of a distortion equation.

In some examples, the memory 806 a first subset of plurality of ADCs is configured to store a first distortion correction term for correcting a first type of error and the memory 808 is a second subset of the plurality of ADCs configured to store a second distortion correction term different than the first distortion correction term for correct-ing a second type of error. For example, the first type of error is common to all of the plurality of ADCs.

As mentioned above, in some examples, the plurality of ADCs include an interleaved ADC having a first sub-ADC and a second sub-ADC. In some such examples, the first distortion correction term corrects a nonlinearity and the second distortion correction term corrects the nonlinearity plus an error of the second sub-ADC relative to the first sub-ADC. In some examples, the error of the second sub-ADC relative to the first sub-ADC is an interleaving mis-match error, such as offset and/or gain errors.

The techniques of FIG. 8 permit the storage of different entries in memories, e.g., lookup tables, across parallel processing paths. As such, many errors, e.g., interleaving errors, DDR errors, etc., that are unique to a particular sub-ADC (or a sub-DAC) may be addressed in an inter-leaved ADC (or digital-to-analog converter (DAC)) or in an architecture that behaves as an interleaved converter.

FIG. 9 is a flow diagram of an example of a method 900 for correcting distortion in an analog input signal. The method 900 corresponds to the techniques described with respect to FIG. 8. The processor 132 of FIG. 1 may generate signals to control one or more actions described with respect to the method 900.

At block 902, the method 900 stores, in a subset of memories, a first distortion correction term for correcting a first type of error. At block 904, the method 900 stores, in a second subset of the memories, a second distortion correc-tion term different than the first distortion correction term for correcting a second type of error.

In some examples, the first type of error is common to all of the plurality of ADCs. In some examples, the first distortion correction term corrects a nonlinearity and the second distortion correction term corrects the nonlinearity plus an error of the second sub-ADC relative to the first sub-ADC. In some examples, the error of the second sub-ADC relative to the first sub-ADC is an interleaving mis-match error. In some examples, the two or more distortion correction terms are time delayed.

In some examples, each memory includes a plurality of memory addresses, and the method 900 includes storing in at least some of the plurality of memory addresses a con-catenation of two or more distortion correction terms of a distortion equation.

At block 906, the method 900 receives, using a plurality of analog-to-digital converters (ADCs), the analog input signal having the distortion. In some examples, receiving, using the plurality of analog-to-digital converters (ADCs), the analog input signal having the distortion includes receiv-ing, using an interleaved ADC having a first sub-ADC and a second sub-ADC. In some examples, receiving, using the plurality of analog-to-digital converters (ADCs), the analog input signal having the distortion includes receiving, using at least two ADCs, the analog input signal having the distortion.

At block 908, the method 900 generates, via each of the plurality of ADCs, an N-bit digital signal from a sequence of samples. At block 910, the method 900 processes, via a plurality of parallel processing paths, the sequence of samples to generate processed sequences, wherein each path corresponds to one of the ADCs. At block 912, the method 900 applies the first distortion correction term and the second distortion correction term to the processed sequences. At block 914, the method 900 generates a correction O-bit digital signal.

Various Aspects

Aspect 1 may include or use subject matter (e.g., a system, apparatus, method, article, or the like) that can include or use a system for correcting distortion in an analog input signal, the system comprising: an analog-to-digital converter configured for receiving the analog input signal having the distortion, the analog-to-digital converter configured for generating an N-bit digital signal; and a digital processing circuit configured for receiving the N-bit digital signal, the digital processing including: a memory having a plurality of memory addresses and configured for receiving the N-bit digital signal, wherein at least some of the plurality of memory addresses are configured to store a concatenation of two or more distortion correction terms; wherein the digital processing circuit is configured for: modifying the N-bit digital signal to generate a modified signal; applying the modified signal to the memory, wherein the modified signal represents one of the plurality of memory addresses; outputting, from the memory, an M-bit output representing contents of the memory address specified by the modified signal; modifying the M-bit output to separate the M-bit output into the two or more distortion correction terms; generating, based on the two or more distortion correction terms, a correction digital signal; and applying the correction digital signal to the N-bit digital signal.

Aspect 2 may include or use or may optionally be combined with at least some features of Aspect 1 to include or use the system wherein modifying the N-bit digital signal includes reducing the number of bits of the N-bit digital signal.

Aspect 3 may include or use or may optionally be combined with at least some features of any one or more of Aspect 1 or Aspect 2 to include or use the system wherein modifying the N-bit digital signal includes applying dither to the N-bit digital signal.

Aspect 4 may include or use or may optionally be combined with at least some features of any one or more of Aspect 1 through Aspect 3 to include or use the system wherein modifying the N-bit digital signal includes applying gain to the N-bit digital signal.

Aspect 5 may include or use or may optionally be combined with at least some features of any one or more of Aspect 1 through Aspect 4 to include or use the system wherein the two or more distortion correction terms have variable bit-width.

Aspect 6 may include or use or may optionally be combined with at least some features of any one or more of Aspect 1 through Aspect 5 to include or use the system wherein the two or more distortion correction terms are time delayed.

Aspect 7 may include or use or may optionally be combined with at least some features of any one or more of Aspect 1 through Aspect 6 to include or use the system wherein the digital processing circuit configured for modifying the N-bit digital signal to generate the modified signal is configured for: applying a scaling factor B to the N-bit digital signal, wherein the two or more distortion correction terms are scaled by 1/B.

Aspect 8 may include or use or may optionally be combined with at least some features of any one or more of Aspect 1 through Aspect 7 to include or use the system wherein the digital processing circuit is configured for: applying a scaling factor to the M-bit output.

Aspect 9 may include or use or may optionally be combined with at least some features of any one or more of Aspect 1 through Aspect 8 to include or use the system wherein the memory has a size of Q×M, and wherein each memory address corresponds to an M-bit word.

Aspect 10 may include or use subject matter (e.g., a system, apparatus, method, article, or the like) that may include or use a method for correcting distortion in an analog input signal, the method comprising: storing, in a memory having a plurality of memory addresses, a concatenation of two or more distortion correction terms; receiving, based on the analog input signal having the distortion, an N-bit digital signal; modifying the N-bit digital signal to generate a modified signal; applying the modified signal to the memory, wherein the modified signal represents one of the plurality of memory addresses; outputting, from the memory, an M-bit output representing contents of the memory address specified by the modified signal; modifying the M-bit output to separate the M-bit output into the two or more distortion correction terms; generating, based on the two or more distortion correction terms, a correction digital signal; and applying the correction digital signal to the N-bit digital signal.

Aspect 11 may include or use or may optionally be combined with at least some features of Aspect 10 to include or use the method wherein modifying the N-bit digital signal includes reducing the number of bits of the N-bit digital signal.

Aspect 12 may include or use or may optionally be combined with at least some features of Aspect 10 to include or use the method wherein modifying the N-bit digital signal includes applying dither to the N-bit digital signal.

Aspect 13 may include or use or may optionally be combined with at least some features of any one or more of Aspect 10 through Aspect 12 to include or use the method wherein modifying the N-bit digital signal includes applying gain to the N-bit digital signal.

Aspect 14 may include or use or may optionally be combined with at least some features of any one or more of Aspect 10 through Aspect 13 to include or use the method wherein the two or more distortion correction terms have variable bit-width.

Aspect 15 may include or use or may optionally be combined with at least some features of any one or more of Aspect 10 through Aspect 14 to include or use the method wherein the two or more distortion correction terms are time delayed.

Aspect 16 may include or use or may optionally be combined with at least some features of any one or more of Aspect 10 through Aspect 15 to include or use the method wherein modifying the N-bit digital signal to generate the modified signal includes: applying a scaling factor B to the N-bit digital signal, wherein the two or more distortion correction terms are scaled by 1/B.

Aspect 17 may include or use or may optionally be combined with at least some features of any one or more of Aspect 10 through Aspect 16 to include or use the method comprising: applying a scaling factor to the M-bit output.

Aspect 18 may include or use subject matter (e.g., a system, apparatus, method, article, or the like) that may include or use a system for correcting distortion in an analog input signal, the system including an analog-to-digital converter configured for receiving the analog input signal having the distortion, the analog-to-digital converter configured for generating an N-bit digital signal, the system comprising: a digital processing circuit configured for receiving the N-bit digital signal, the digital processing including: a memory having a plurality of memory addresses and configured for receiving the N-bit digital signal; wherein the digital processing circuit is configured for: concatenating two or more distortion correction terms; storing the concatenation of the two or more distortion correction terms in a memory address; modifying the N-bit digital signal to generate a modified signal; applying the modified signal to the memory, wherein the modified signal represents one of the plurality of memory addresses; outputting, from the memory, an M-bit output representing contents of the memory address specified by the modified signal; modifying the M-bit output to separate the M-bit output into the two or more distortion correction terms; generating, based on the two or more distortion correction terms, a correction digital signal; and applying the correction digital signal to the N-bit digital signal.

Aspect 19 may include or use or may optionally be combined with at least some features of Aspect 18 to include or use the system wherein modifying the N-bit digital signal includes reducing the number of bits of the N-bit digital signal.

Aspect 20 may include or use or may optionally be combined with at least some features of any one or more of Aspect 18 or Aspect 19 to include or use the system wherein modifying the N-bit digital signal includes applying dither to the N-bit digital signal.

Aspect 21 may include or use subject matter (e.g., a system, apparatus, method, article, or the like) that may include or use a system for correcting distortion in an analog input signal, the system comprising: a plurality of primary memories configured to store operational data for signal processing; at least one replica memory configured to store update data, wherein the number of replica memories is less than the number of primary memories; a digital data path configured to receive outputs from the primary memories and the replica memory; data selectors associated with corresponding ones of the primary memories and the replica memory, the data selectors configured to selectively connect buses associated with the respective memories, wherein the data selectors are configured to receive a signal representing an update state for the primary memories, and wherein the data selectors are configured to respond to the signal by enabling the update of the primary memories with the update data from the at least one replica memory.

Aspect 22 may include or use or may optionally be combined with at least some features of Aspect 21 to include or use the system wherein the least one replica memory is one replica memory.

Aspect 23 may include or use or may optionally be combined with at least some features of any one or more of Aspect 21 or Aspect 22 to include or use the system wherein the least one replica memory ranges from one to PM−1, wherein PM is the total number of primary memories.

Aspect 24 may include or use or may optionally be combined with at least some features of any one or more of Aspect 21 through Aspect 23 to include or use the system wherein the at least one replica memory is half the number of primary memories.

Aspect 25 may include or use or may optionally be combined with at least some features of any one or more of Aspect 21 through Aspect 24 to include or use the system comprising: an operational mode, wherein the plurality of primary memories provide outputs based on current operational data during non-update periods, wherein the operational data is based on a representation of an input signal; an update mode, wherein the at least one replica memory provides outputs based on the update data during update periods, and wherein one or more of the plurality of primary memories are updated with the update data from the at least one replica memory, and wherein the roles of the plurality of primary memories and the at least one replica memory are interchangeably switched such that a primary memory becomes a replica memory for receiving update data, and the replica memory becomes a primary memory for providing outputs to the digital data path.

Aspect 26 may include or use or may optionally be combined with at least some features of any one or more of Aspect 21 through Aspect 25 to include or use the system wherein the update mode is performed without requiring a one-to-one correspondence between the primary memories and the replica memories.

Aspect 27 may include or use or may optionally be combined with at least some features of any one or more of Aspect 21 through Aspect 26 to include or use the system wherein the update mode includes a rolling update process that updates each of the plurality of primary memories using the at least one replica memory.

Aspect 28 may include or use or may optionally be combined with at least some features of any one or more of Aspect 21 through Aspect 27 to include or use the system wherein the signal includes a bit indicator for each memory that signals whether the memory is in an update mode or an operational mode, and the data selectors are configured to switch between the update mode and the operational mode based on the bit indicator.

Aspect 29 may include or use or may optionally be combined with at least some features of any one or more of Aspects 21 through 28 to include or use the system wherein the primary memories and the at least one replica memory are used for correcting distortions in a signal processing path, and the update data includes distortion correction terms for compensating for variations in a signal processing environment.

Aspect 30 may include or use subject matter (e.g., a system, apparatus, method, article, or the like) that may include or use a method for correcting distortion in an analog input signal, the method comprising: storing, in a plurality of primary memories, operational data for signal processing; storing, in at least one replica memory, update data, wherein the number of replica memories is less than the number of primary memories; receiving outputs from the primary memories and the replica memory; selectively connecting buses associated with corresponding ones of the primary memories and the at least one replica memory; generating a signal representing an update state for the primary memories; and updating the primary memories with the update data from the at least one replica memory.

Aspect 31 may include or use or may optionally be combined with at least some features of Aspect 30 to include or use the method wherein the least one replica memory is one replica memory.

Aspect 32 may include or use or may optionally be combined with at least some features of any one or more of Aspect 30 or Aspect 31 to include or use the method wherein the least one replica memory ranges from one to PM−1, wherein PM is the total number of primary memories.

Aspect 33 may include or use or may optionally be combined with at least some features of any one or more of Aspect 30 through Aspect 32 to include or use the method wherein the at least one replica memory is half the number of primary memories.

Aspect 34 may include or use or may optionally be combined with at least some features of any one or more of Aspect 30 through Aspect 33 to include or use the method comprising: operating in at least one of: an operational mode wherein the plurality of primary memories provide outputs based on current operational data during non-update periods, wherein the operational data is based on a representation of an input signal; an update mode wherein the at least one replica memory provides outputs based on the update data during update periods, wherein one or more of the plurality of primary memories are updated with the update data from the replica memory, and wherein the roles of the plurality of primary memories and the at least one replica memory are interchangeably switched such that a primary memory becomes a replica memory for receiving update data, and the replica memory becomes a primary memory for providing outputs to the digital data path.

Aspect 35 may include or use or may optionally be combined with at least some features of any one or more of Aspect 30 through Aspect 34 to include or use the method comprising: performing the update mode without requiring a one-to-one correspondence between the plurality of primary memories and the at least one replica memory.

Aspect 36 may include or use or may optionally be combined with at least some features of any one or more of Aspect 30 through Aspect 35 to include or use the method comprising: performing the update mode using a rolling update process that updates each of the plurality of primary memories using the at least one replica memory.

Aspect 37 may include or use subject matter (e.g., a system, apparatus, method, article, or the like) that may include or use a system for correcting distortion in an analog input signal, the system comprising: a digital processing circuit including: a plurality of primary memories configured to store operational data for signal processing; at least one replica memory configured to store update data, wherein the number of replica memories is less than the number of primary memories; a digital data path configured to receive outputs from the primary memories and the replica memory; data selectors associated with corresponding ones of the primary memories and the replica memory, the data selectors configured to selectively connect buses associated with the respective memories, wherein the digital processing circuit is configured for receiving a signal representing an update state for the primary memories, wherein the data selectors respond to the signal by enabling the update of the primary memories with the update data from the at least one replica memory, and wherein the digital processing circuit is configured for operating in at least one of: an operational mode wherein the plurality of primary memories provide outputs based on current operational data during non-update periods, wherein the operational data is based on a representation of an input signal; an update mode wherein the at least one replica memory provides outputs based on the update data during update periods, wherein one or more of the plurality of primary memories are updated with the update data from the replica memory, and wherein the roles of the plurality of primary memories and the at least one replica memory are interchangeably switched such that a primary memory becomes a replica memory for receiving update data, and the replica memory becomes a primary memory for providing outputs to the digital data path.

Aspect 38 may include or use or may optionally be combined with at least some features of Aspect 37 to include or use the system wherein the least one replica memory is one replica memory.

Aspect 39 may include or use or may optionally be combined with at least some features of any one or more of Aspect 37 or Aspect 38 to include or use the system wherein the least one replica memory ranges from one to PM−1, wherein PM is the total number of primary memories.

Aspect 40 may include or use or may optionally be combined with at least some features of any one or more of Aspect 37 through Aspect 39 to include or use the system wherein the update mode includes a rolling update process that updates each of the plurality of primary memories using the at least one replica memory.

Aspect 41 may include or use subject matter (e.g., a system, apparatus, method, article, or the like) that may include or use a system for correcting distortion in an analog input signal, the system comprising: a plurality of analog-to-digital converters (ADCs) configured for receiving the analog input signal having the distortion, each of the analog-to-digital converters configured for generating an N-bit digital signal, each of the plurality of ADCs configured for generating a sequence of samples; and a digital processing circuit configured for receiving each of the N-bit digital signals, the digital processing circuit including: a plurality of parallel processing paths, each path corresponding to one of the ADCs and configured to process the sequence of samples to generate processed sequences; and a plurality of memories, each memory associated with one of the parallel processing paths and configured for storing distortion correction terms, wherein the digital processing circuit is configured for: applying the distortion correction terms from the memories to the processed sequences; and generating a correction O-bit digital signal, wherein a first subset of the memories is configured for storing a first distortion correction term for correcting a first type of error, and wherein a second subset of the memories is configured for storing a second distortion correction term different than the first distortion correction term for correcting a second type of error.

Aspect 42 may include or use or may optionally be combined with at least some features of Aspect 41 to include or use the system wherein the first type of error is common to all of the plurality of ADCs.

Aspect 43 may include or use or may optionally be combined with at least some features of any one or more of Aspect 41 through Aspect 42 to include or use the system wherein the plurality of ADCs include an interleaved ADC having a first sub-ADC and a second sub-ADC.

Aspect 44 may include or use or may optionally be combined with at least some features of any one or more of Aspect 41 through Aspect 43 to include or use the system wherein the first distortion correction term corrects a non-linearity and the second distortion correction term corrects the nonlinearity plus an error of the second sub-ADC relative to the first sub-ADC.

Aspect 45 may include or use or may optionally be combined with at least some features of any one or more of Aspect 41 through Aspect 44 to include or use the system wherein the error of the second sub-ADC relative to the first sub-ADC is an interleaving mismatch error.

Aspect 46 may include or use or may optionally be combined with at least some features of any one or more of Aspect 41 through Aspect 45 to include or use the system wherein the plurality of ADCs comprises at least two ADCs.

Aspect 47 may include or use or may optionally be combined with at least some features of any one or more of Aspect 41 through Aspect 46 to include or use the system wherein each memory includes a plurality of memory addresses, wherein at least some of the plurality of memory addresses are configured to store a concatenation of two or more distortion correction terms.

Aspect 48 may include or use or may optionally be combined with at least some features of any one or more of Aspect 41 through Aspect 47 to include or use the system wherein the two or more distortion correction terms are time delayed.

Aspect 49 may include or use subject matter (e.g., a system, apparatus, method, article, or the like) that may include or use a method for correcting distortion in an analog input signal, the method comprising: storing, in a subset of memories, first distortion correction terms for correcting a first type of error; storing, in a second subset of the memories, a second distortion correction term different than the first distortion correction term for correcting a second type of error; receiving, using a plurality of analog-to-digital converters (ADCs), the analog input signal having the distortion; generating, via each of the plurality of ADCs, an N-bit digital signal from a sequence of samples; processing, via a plurality of parallel processing paths, the sequence of samples to generate processed sequences, wherein each path corresponds to one of the ADCs; applying the first correction distortion correction term and the second distortion correction term to the processed sequences; and generating a correction O-bit digital signal.

Aspect 50 may include or use or may optionally be combined with at least some features of Aspect 49 to include or use the method wherein the first type of error is common to all of the plurality of ADCs.

Aspect 51 may include or use or may optionally be combined with at least some features of one or more of Aspect 49 or Aspect 50 to include or use the method wherein receiving, using the plurality of analog-to-digital converters (ADCs), the analog input signal having the distortion includes: receiving, using an interleaved ADC having a first sub-ADC and a second sub-ADC.

Aspect 52 may include or use or may optionally be combined with at least some features of one or more of Aspect 49 through Aspect 51 to include or use the method wherein the first distortion correction term corrects a non-linearity and the second distortion correction term corrects the nonlinearity plus an error of the second sub-ADC relative to the first sub-ADC.

Aspect 53 may include or use or may optionally be combined with at least some features of one or more of Aspect 49 through Aspect 52 to include or use the method wherein the error of the second sub-ADC relative to the first sub-ADC is an interleaving mismatch error.

Aspect 54 may include or use or may optionally be combined with at least some features of one or more of Aspect 49 through Aspect 53 to include or use the method wherein receiving, using the plurality of analog-to-digital converters (ADCs), the analog input signal having the distortion includes: receiving, using at least two ADCs, the analog input signal having the distortion.

Aspect 55 may include or use or may optionally be combined with at least some features of one or more of Aspect 49 through Aspect 54 to include or use the method wherein each memory includes a plurality of memory addresses, the method comprising: storing in at least some of the plurality of memory addresses a concatenation of two or more distortion correction terms.

Aspect 56 may include or use or may optionally be combined with at least some features of one or more of Aspect 49 through Aspect 55 to include or use the method wherein the two or more distortion correction terms are time delayed.

Aspect 57 may include or use subject matter (e.g., a system, apparatus, method, article, or the like) that may include or use a system for correcting distortion in an analog input signal, the system comprising: an interleaved ADC having a first sub-ADC and a second sub-ADC and configured for receiving the analog input signal having the distortion, each of the first sub-ADC and the second sub-ADC configured for generating an N-bit digital signal from a sequence of samples; and a digital processing circuit configured for receiving each of the N-bit digital signals, the digital processing circuit including: a plurality of parallel processing paths, each path corresponding to one of the ADCs and configured to process the sequence of samples to generate processed sequences; and a plurality of memories, each memory associated with one of the parallel processing paths and configured for storing distortion correction terms, wherein the digital processing circuit is configured for: applying the correction distortion correction terms from the memories to the processed sequences; and generating a correction O-bit digital signal, wherein a first subset of the memories is configured for storing a first distortion correction term for correcting a first type of error, and wherein a second subset of the memories is configured for storing a second distortion correction term different than the first distortion correction term for correcting a second type of error.

Aspect 58 may include or use or may optionally be combined with at least some features of Aspect 57 to include or use the system wherein the first distortion correction term corrects a nonlinearity and the second distortion correction term corrects the nonlinearity plus an error of the second sub-ADC relative to the first sub-ADC.

Aspect 59 may include or use or may optionally be combined with at least some features of one or more of Aspect 57 or Aspect 58 to include or use the system wherein the error of the second sub-ADC relative to the first sub-ADC is an interleaving mismatch error.

Aspect 60 may include or use or may optionally be combined with at least some features of one or more of Aspect 57 through Aspect 59 to include or use the system wherein each memory includes a plurality of memory addresses, wherein at least some of the plurality of memory addresses are configured to store a concatenation of two or more distortion correction terms.

Aspect 61 may include or use subject matter (e.g., a system, apparatus, method, article, or the like) that may include or use a system for reducing noise in a digitized input signal, the system comprising: an analog-to-digital converter configured for receiving an analog input signal having the noise, the analog-to-digital converter configured for generating an N-bit digital signal; a digital processing circuit configured for receiving the N-bit digital signal, the digital processing circuit including: first and second memories, wherein each of the first and second memories includes a plurality of memory addresses, wherein the first memory is configured for storing a first distortion correction term in at least some of the plurality of memory addresses of the first memory, and wherein the second memory is configured for storing a second distortion correction term in at least some of the plurality of memory addresses of the second memory; and a dither generator configured for generating a dither signal, wherein the digital processing circuit is configured for: combining the N-bit digital signal with a positive representation of the dither signal to generate a first combined signal; combining the N-bit digital signal with a negative representation of the dither signal to generate a second combined signal; applying the first combined signal to the first memory, wherein the first combined signal represents one of the plurality of memory addresses of the first memory; outputting, from the first memory, a first memory output representing contents of a first memory address specified by the first combined signal; applying the second combined signal to the second memory, wherein the second combined signal represents one of the plurality of memory addresses of the second memory; outputting, from the second memory, a second memory output representing contents of a second memory address specified by the second combined signal; and generating a noise-corrected N-bit digital signal by combining the first memory output and the second memory output signal.

Aspect 62 may include or use or may optionally be combined with at least some features of Aspect 61 to include or use the system comprising: modifying the first combined signal before applying the first combined signal to the first memory; and modifying the second combined signal before applying the second combined signal to the second memory.

Aspect 63 may include or use or may optionally be combined with at least some features of one or more of Aspect 61 or Aspect 62 to include or use the system wherein the first distortion correction term and the second distortion correction term are the same distortion correction term.

Aspect 64 may include or use or may optionally be combined with at least some features of one or more of Aspect 61 through Aspect 63 to include or use the system comprising: modifying the combination of the first memory output and the second memory output.

Aspect 65 may include or use or may optionally be combined with at least some features of one or more of Aspect 61 through Aspect 64 to include or use the system wherein the first distortion correction term and the second distortion correction term are configured for correcting a first type of error.

Aspect 66 may include or use or may optionally be combined with at least some features of one or more of Aspect 61 through Aspect 65 to include or use the system wherein the first type of error includes a nonlinearity error.

Aspect 67 may include or use or may optionally be combined with at least some features of one or more of Aspect 61 through Aspect 66 to include or use the system wherein the nonlinearity error is higher than first-order linearity error.

Aspect 68 may include or use subject matter (e.g., a system, apparatus, method, article, or the like) that may include or use a method for reducing noise in a digitized input signal, the method comprising: storing, in at least some of a plurality of memory addresses of a first memory, a first distortion correction term; storing, in at least some of a plurality of memory addresses of a second memory, a second distortion correction term; receiving an analog input signal having the noise; generating, based on the analog input signal, an N-bit digital signal; combining the N-bit digital signal with a positive representation of a dither signal to generate a first combined signal; combining the N-bit digital signal with a negative representation of the dither signal to generate a second combined signal; applying the first combined signal to the first memory, wherein the first combined signal represents one of the plurality of memory addresses of the first memory; outputting, from the first memory, a first memory output representing contents of a first memory address specified by the first combined signal; applying the second combined signal to the second memory, wherein the second combined signal represents one of the plurality of memory addresses of the second memory; outputting, from the second memory, a second memory output representing contents of a second memory address specified by the second combined signal; and generating a noise-corrected N-bit digital signal by combining the first memory output and the second memory output.

Aspect 69 may include or use or may optionally be combined with at least some features of Aspect 68 to include or use the method comprising: modifying the first combined signal before applying the first combined signal to the first memory; and modifying the second combined signal before applying the second combined signal to the second memory.

Aspect 70 may include or use or may optionally be combined with at least some features of one or more of Aspect 67 or Aspect 69 to include or use the method wherein modifying the first combined signal before applying the first combined signal to the first memory includes reducing the number of bits.

Aspect 71 may include or use or may optionally be combined with at least some features of one or more of Aspect 67 through Aspect 70 to include or use the method comprising: modifying the combination of the first memory output and the second memory output.

Aspect 72 may include or use or may optionally be combined with at least some features of one or more of Aspect 67 through Aspect 71 to include or use the method wherein the first distortion correction term and the second distortion correction term are the same distortion correction term.

Aspect 73 may include or use or may optionally be combined with at least some features of one or more of Aspect 67 through Aspect 72 to include or use the method wherein the first distortion correction term and the second distortion correction term are configured for correcting a first type of error.

Aspect 74 may include or use or may optionally be combined with at least some features of one or more of Aspect 67 through Aspect 73 to include or use the method wherein the first type of error includes a nonlinearity error.

Aspect 75 may include or use or may optionally be combined with at least some features of one or more of Aspect 67 through Aspect 74 to include or use the method wherein the nonlinearity error is higher than a first-order linearity error.

Aspect 76 may include or use subject matter (e.g., a system, apparatus, method, article, or the like) that may include or use a system for reducing noise in a digitized input signal, the system comprising: an analog-to-digital converter configured for receiving an analog input signal having the noise, the analog-to-digital converter configured for generating an N-bit digital signal; and a dither generator configured for generating a dither signal, wherein the digital processing circuit is configured for: combining the N-bit digital signal with a positive representation of the dither signal to generate a first combined signal; combining the N-bit digital signal with a negative representation of the dither signal to generate a second combined signal; applying the first combined signal to a first memory, wherein the first combined signal represents one of the plurality of memory addresses of the first memory; outputting, from the first memory, a first memory output representing contents of a first memory address specified by the first combined signal; applying the second combined signal to a second memory, wherein the second combined signal represents one of the plurality of memory addresses of the second memory; outputting, from the second memory, a second memory output representing contents of a second memory address specified by the second combined signal; and generating a noise-corrected N-bit digital signal by combining the first memory output and the second memory output.

Aspect 77 may include or use or may optionally be combined with at least some features of Aspect 76 to include or use the system wherein at least some of the plurality of memory addresses are configured to store a concatenation of two or more distortion correction terms.

Aspect 78 may include or use or may optionally be combined with at least some features of one or more of Aspect 76 or Aspect 77 to include or use the system wherein the first memory is configured for storing a first distortion correction term in at least some of the plurality of memory addresses of the first memory, and wherein the second memory is configured for storing a second distortion correction term in at least some of the plurality of memory addresses of the second memory.

Aspect 79 may include or use or may optionally be combined with at least some features of one or more of Aspect 76 through Aspect 78 to include or use the system wherein the first distortion correction term and the second distortion correction term are configured for correcting a first type of error.

Aspect 80 may include or use or may optionally be combined with at least some features of one or more of Aspect 76 through Aspect 79 to include or use the system wherein the first type of error includes a nonlinearity error.

VARIOUS NOTES

Each of the non-limiting claims or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more claims thereof), either with respect to a particular example (or one or more claims thereof), or with respect to other examples (or one or more claims thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more claims thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A system for correcting distortion in an analog input signal, the system comprising: an analog-to-digital converter configured for receiving the analog input signal having the distortion, the analog-to-digital converter configured for generating an N-bit digital signal; and a digital processing circuit configured for receiving the N-bit digital signal, the digital processing circuit including:

a memory having a plurality of memory addresses and configured for receiving the N-bit digital signal, wherein at least some of the plurality of memory addresses are configured to store a concatenation of two or more distortion correction terms; wherein the digital processing circuit is configured for: modifying the N-bit digital signal to generate a modified signal; applying the modified signal to the memory, wherein the modified signal represents one of the plurality of memory addresses; outputting, from the memory, an M-bit output representing contents of the memory address specified by the modified signal; modifying the M-bit output to separate the M-bit output into the two or more distortion correction terms; generating, based on the two or more distortion correction terms, a correction digital signal; and applying the correction digital signal to the N-bit digital signal.

2. The system of claim 1, wherein modifying the N-bit digital signal includes reducing the number of bits of the N-bit digital signal.

3. The system of claim 1, wherein modifying the N-bit digital signal includes applying dither to the N-bit digital signal.

4. The system of claim 1, wherein modifying the N-bit digital signal includes applying gain to the N-bit digital signal.

5. The system of claim 1, wherein the two or more distortion correction terms have variable bit-width.

6. The system of claim 1, wherein the two or more distortion correction terms are time delayed.

7. The system of claim 1, wherein the digital processing circuit configured for modifying the N-bit digital signal to generate the modified signal is configured for:

applying a scaling factor B to the N-bit digital signal, wherein the two or more distortion correction terms are scaled by 1/B.

8. The system of claim 1, wherein the digital processing circuit is configured for:

applying a scaling factor to the M-bit output.

9. The system of claim 1, wherein the memory has a size of Q×M, and wherein each memory address corresponds to an M-bit word.

10. A method for correcting distortion in an analog input signal, the method comprising:

storing, in a memory having a plurality of memory addresses, a concatenation of two or more distortion correction terms;

receiving, based on the analog input signal having the distortion, an N-bit digital signal;

modifying the N-bit digital signal to generate a modified signal;

applying the modified signal to the memory, wherein the modified signal represents one of the plurality of memory addresses;

outputting, from the memory, an M-bit output representing contents of the memory address specified by the modified signal;

modifying the M-bit output to separate the M-bit output into the two or more distortion correction terms;

generating, based on the two or more distortion correction terms, a correction digital signal; and applying the correction digital signal to the N-bit digital signal.

11. The method of claim 10, wherein modifying the N-bit digital signal includes reducing the number of bits of the N-bit digital signal.

12. The method of claim 10, wherein modifying the N-bit digital signal includes applying dither to the N-bit digital signal.

13. The method of claim 10, wherein modifying the N-bit digital signal includes applying gain to the N-bit digital signal.

14. The method of claim 10, wherein the two or more distortion correction terms have variable bit-width.

15. The method of claim 10, wherein the two or more distortion correction terms are time delayed.

16. The method of claim 10, wherein modifying the N-bit digital signal to generate the modified signal includes:

applying a scaling factor B to the N-bit digital signal, wherein the two or more distortion correction terms are scaled by 1/B.

17. The method of claim 10, comprising:

applying a scaling factor to the M-bit output.

18. A system for correcting distortion in an analog input signal, the system including an analog-to-digital converter configured for receiving the analog input signal having the distortion, the analog-to-digital converter configured for generating an N-bit digital signal, the system comprising:

a digital processing circuit configured for receiving the N-bit digital signal, the digital processing including:

a memory having a plurality of memory addresses and configured for receiving the N-bit digital signal;

wherein the digital processing circuit is configured for:

concatenating two or more distortion correction terms;

storing the concatenation of the two or more distortion correction terms in a memory address;

modifying the N-bit digital signal to generate a modified signal;

applying the modified signal to the memory, wherein the modified signal represents one of the plurality of memory addresses;

outputting, from the memory, an M-bit output representing contents of the memory address specified by the modified signal;

modifying the M-bit output to separate the M-bit output into the two or more distortion correction terms;

generating, based on the two or more distortion correction terms, a correction digital signal; and applying the correction digital signal to the N-bit digital signal.

19. The system of claim 18, wherein modifying the N-bit digital signal includes reducing the number of bits of the N-bit digital signal.

20. The system of claim 18, wherein modifying the N-bit digital signal includes applying dither to the N-bit digital signal.

* * * * *